(12) United States Patent
Yuan et al.

(10) Patent No.: US 11,054,090 B2
(45) Date of Patent: Jul. 6, 2021

(54) HIGH GAMUT INDEX SOLID-STATE WHITE LIGHT EMITTING DEVICES

(71) Applicant: Intematix Corporation, Fremont, CA (US)

(72) Inventors: Xianglong Yuan, Manteca, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 16/775,172

(22) Filed: Jan. 28, 2020

(65) Prior Publication Data
US 2020/0240596 A1 Jul. 30, 2020

Related U.S. Application Data

(60) Provisional application No. 62/798,369, filed on Jan. 29, 2019.

(51) Int. Cl.
| | |
|---|---|
| *F21K 9/64* | (2016.01) |
| *H01L 25/075* | (2006.01) |
| *F21Y 105/12* | (2016.01) |
| *H01L 33/54* | (2010.01) |
| *H01L 33/62* | (2010.01) |
| *F21Y 115/10* | (2016.01) |

(52) U.S. Cl.
CPC ............ *F21K 9/64* (2016.08); *H01L 25/0753* (2013.01); *F21Y 2105/12* (2016.08); *F21Y 2115/10* (2016.08); *H01L 33/54* (2013.01); *H01L 33/62* (2013.01)

(58) Field of Classification Search
CPC .......... H01L 33/50–508; H01L 25/075; H01L 25/0753; F21K 9/64
See application file for complete search history.

(56) References Cited

U.S. PATENT DOCUMENTS

| | | | |
|---|---|---|---|
| 10,371,325 B1 * | 8/2019 | Yuan | H01L 33/507 |
| 2012/0300432 A1 * | 11/2012 | Matsubayashi | C09K 11/7774 |
| | | | 362/84 |
| 2017/0223786 A1 * | 8/2017 | Petluri | F21V 5/04 |

(Continued)

FOREIGN PATENT DOCUMENTS

CN 102428755 A * 4/2012 ............. H05B 45/20

*Primary Examiner* — Mariceli Santiago
(74) *Attorney, Agent, or Firm* — CrossPond Law

(57) ABSTRACT

A white light emitting device includes a solid-state excitation source operable to generate excitation light having a dominant wavelength ranging from 440 nm to 455 nm; a first photoluminescence material which generates light having a peak emission wavelength ranging from 500 nm to 530 nm; and a second photoluminescence material which generates light having a peak emission wavelength ranging from 640 nm to 690 nm, where the device is operable to generate white light with an IEC TM-30 Gamut Index $R_g$ ranging from 105 to 115. The device can be operable to generate white light having an IEC TM-30 Fidelity Index $R_f$ which ranges from 85 to 95 and a sum of Gamut Index $R_g$ and fidelity index $R_f$ is greater than or equal to 195 and less than or equal to 200.

15 Claims, 10 Drawing Sheets

SECTION A-A

(56) References Cited

U.S. PATENT DOCUMENTS

2018/0204985 A1\* 7/2018 Li .................. H01L 33/504
2018/0323350 A1\* 11/2018 Oh .................. C09K 11/7734
2020/0083409 A1\* 3/2020 Han .................. H05B 45/10

\* cited by examiner

SECTION A-A

SECTION B-B

SECTION C-C

HIGH GAMUT INDEX SOLID-STATE WHITE LIGHT EMITTING DEVICES

CROSS-REFERENCE TO RELATED APPLICATIONS

This application claims the benefit of priority to U.S. Provisional Application No. 62/798,369, filed on Jan. 29, 2019, entitled "High Gamut Index Solid-State White Light Emitting Devices", which is hereby incorporated by reference in its entirety

FIELD OF THE INVENTION

Embodiments of the present invention are directed to solid-state white light emitting devices comprising photoluminescence wavelength conversion materials. More particularly, although not exclusively, embodiments concern solid-state white light emitting devices for generating white light having a high Gamut Index $R_g$.

BACKGROUND OF THE INVENTION

White light emitting LEDs ("white LEDs") include one or more photoluminescence materials (typically inorganic phosphor materials), which absorb a portion of the blue light emitted by the LED and re-emit visible light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps.

Various metrics exist for quantifying the characteristics and quality of light generated by white lighting sources. The two most commonly used metrics within the solid-state lighting industry are, Correlated Color Temperature (CCT) and International Commission on Illumination (CIE) General Color Rendering Index (CRI) Ra.

The CCT of a lighting source is measured in kelvin (K) and is the temperature of a Plankian (blackbody) radiator that radiates light of a color that corresponds to the color of the light generated by the lighting source.

The General CRI Ra characterizes how faithfully a lighting source renders the true colors of an object and is based on a measure of how well a lighting source's illumination of eight color test samples (R1 to R8) compares with the illumination provided by a reference source. In general, the higher the value indicates its closeness to a black radiator and natural sunlight. General CRI Ra can take negative values and has a maximum value of 100. Since the color samples R1 to R8 are all pastel colors (low saturation colors "Light Grayish Red" to "Reddish Purple") the General CRI Ra gives a useful measure of subtle differences in light output of incandescent sources which generate a full spectrum that closely resembles sunlight. However, for white LEDs whose spectrum is composed of peaks, the General CRI Ra is proving to be inadequate as it is an average measure of color rendition over a limited range of colors and gives no information of the lighting source's performance for particular colors or highly saturated colors. Thus, when characterizing full spectrum solid-state white light emitting devices the CRI color samples R9 to R12 (saturated colors "Saturated Red", "Saturated Yellow", "Saturated Green", "Saturated Blue") and R13 to R15 ("Light Skin Tone", "Leaf Green", "Medium Skin Tone") should be taken into account to give a meaningful characterization of full spectrum light.

To address the limitations of General CRI Ra, the Illuminating Engineering Society (IES) recently published the TM-30 standard for measuring and characterizing the color performance of lighting sources (Illuminating Engineering Society (2015) "Method for Evaluating Light Source Color Rendition" TM-30-15). Under the TM-30-15 standard, two metrics are used to characterize the color rendering characteristics of a lighting source—Fidelity Index ($R_f$) and Gamut Index ($R_g$). It is believed that IES TM-30-15 method has better correlation with people's color perception and, therefore, gives a more accurate characterization of a lighting source's light characteristics. The Fidelity Index $R_f$ is similar to General CRI Ra and characterizes how faithfully a lighting source renders the true colors of an object and is based on a measure of how well a lighting source's illumination of 99 color samples compares with the illumination provided by a reference source. The Fidelity Index $R_f$ value ranges from 0 to 100. The new color samples have been selected to be more representative of objects that are likely to be encountered in real-life applications and, as a result, the Fidelity Index $R_f$ is believed to be a more accurate measure of color rendering than the General CRI Ra. Since $R_f$ is measured over a greater number of color samples, it will be more difficult to achieve high scores compared with the General CRI Ra. Moreover, due to the different testing procedures, General CRI Ra and Fidelity Index $R_f$ values are not comparable against each other.

The Gamut Index $R_g$ focuses on color saturation and is an average level of saturation compared with a reference source. The Gamut Index correlates to the vividness of the appearance of colored objects. The Gamut Index $R_g$ value ranges from 60 to 140 where values below 100 indicate decreased saturation and values above 100 indicate increased saturation compared with the reference source.

The present invention arose in an endeavor to provide solid-state white light emitting devices comprising photoluminescence wavelength conversion materials that generate white light with a high Gamut Index $R_g$ that is above 100, for example.

SUMMARY OF THE INVENTION

According to an aspect of the present invention, there is provided a white light emitting device comprising: a solid-state excitation source operable to generate excitation light having a dominant wavelength ranging from 440 nm to 455 nm (that is in the blue region of the visible spectrum); a first photoluminescence material which generates light having a peak emission wavelength ranging from 500 nm to 530 nm (that is in the green region of the visible spectrum); and a second photoluminescence material which generates light having a peak emission wavelength ranging from 640 nm to 690 nm (that is in the orange to red region of the visible spectrum), wherein the device is operable to generate white light with an IEC TM-30 Gamut Index $R_g$ of greater than or equal to 105; more particularly, the Gamut Index $R_g$ ranging from 105 to 115. A Gamut Index $R_g$ above 100 indicates that the light emitting device generates light having a color saturation that is greater than that of a Plankian (blackbody) radiator of the same color temperature resulting in more vivid colors of illuminated objects. Such an increase in vividness of selected colors can be desirable in many applications such as for example in retail lighting to enhance the appearance of a product. The Gamut Index $R_g$ may range from 105 to 110, or from 105 to 108. Such a range for Gamut Index $R_g$ has been found to be highly desirable and advantageous for many retail lighting applications.

The device can be configured to generate white light having a spectrum comprising one or more spectral features, such as a first and/or second spectral feature, which may be a local minimum (trough) or point of inflection.

It may be that the device is configured to generate white light having a spectrum with a first spectral feature comprising a first local minimum at a first wavelength that ranges from 450 nm to 490 nm or at a first wavelength of about 470 nm. It may be that the first spectral feature has an intensity ranging from 38% to 50% of the intensity of the Plankian spectrum at the first wavelength.

It may be that the device is configured to generate white light having a spectrum with a second spectral feature comprising a second local minimum or point of inflection at a second wavelength that ranges from 550 nm to 600 nm or at a second wavelength of about 570 nm. The second spectral feature may have an intensity ranging from 90% to 96% of the intensity of the Plankian spectrum at the second wavelength.

The type of second spectral feature the spectrum exhibits (i.e. a local minimum or point of inflection) may be attributed to the color temperature of the white light. For example, at lower color temperatures (e.g. such as 2500 K) the second spectral feature tends to be a point of inflection while at higher color temperatures (e.g. such as 5000 K) the second spectral feature can comprise a local minimum.

It may be that the device is operable to generate white light having a spectrum with a spectral feature comprising a wavelength region having an intensity that is greater than the intensity of the Plankian spectrum for wavelength ranging from 508 nm to 555 nm. More particularly, the intensity may be greater than the intensity of the Plankian spectrum by at least one of: at least 102%, and 102% to 112%.

The device may be operable to generate white light having a spectrum with a spectral feature comprising a peak with an intensity that is greater than the Plankian spectrum for wavelengths ranging from 600 nm to 640 nm.

The inventors have found that an emission spectrum having one or more spectral features can increase the Gamut Index $R_g$ of light generated by the device since the spectrum exhibits more pronounced peaks corresponding to blue, green and red regions of the spectrum.

It may be that device is operable to generate white light having an IEC TM-30 Fidelity Index $R_f$ which ranges from 85 to 95 or from 86 to 92. The device can be configured to be operable to generate white light having an IEC TM-30 Fidelity Index $R_f$ which ranges from 86 to 92. It may be that a sum of Gamut Index $R_g$ and fidelity index $R_f$ is greater than or equal to 194 and less than or equal to 200. It may be that a sum of Gamut Index $R_g$ and fidelity index $R_f$ is greater than or equal to 194 and less than or equal to 197.

Further, the device can be configured to be operable to generate white light having a CRI Ra of greater than or equal to 90. The device can be configured to be operable to generate white light having a General CRI Ra of from 90 to 97.

It may be that the light emitting device is operable to generate white light having a color temperature (CCT) ranging from 2500K to 5000K.

The device can be operable to generate white light having a chromaticity that is ranges from 1 to 5 MacAdam ellipses (SDCM—Standard Deviation Color Matching) lower than the blackbody curve on a CIE 1931 chromaticity diagram (CIE x, y). It may be that the device is configured to be operable to generate white light having a chromaticity that is ranges from 1 to 3 MacAdam ellipses (SDCM) below the blackbody curve on a CIE 1931 chromaticity diagram.

The device may be operable to generate white light having a CRI R9 ("Saturated Red") of greater than or equal to about 85.

It may be that the light emitting device has a luminous efficacy of greater than or equal to 240 lm/$W_{opt}$.

The solid-state excitation source can be operable to generate excitation light having a dominant wavelength ranging from 440 nm to 452 nm and can be operable to generate excitation light having a dominant wavelength ranging from 445 nm to 450 nm. The range may be from 447 nm to 450 nm, for example. Shorter wavelength excitation light can increase the Gamut Index $R_g$ by increasing the depth of the first local minimum.

The first photoluminescence material can generate light having a peak emission wavelength ranging from 520 nm to 530 nm.

The second photoluminescence material can generate light having a peak emission wavelength ranging from 650 nm to 670 nm.

At least one of the first or second photoluminescence materials may generate light having a FWHM ranging from 50 nm to 100 nm and can comprise inorganic phosphor materials. The first photoluminescence material can comprise a silicate-based phosphor, or a cerium activated garnet phosphor selected from the group consisting of an yttrium-based YAG phosphor and a lutetium-based LuAG phosphor. The second photoluminescence material can comprise a europium activated nitride-based phosphor such as a CASN phosphor of composition $(Ca_{1-x}Sr_x)AlSiN_3$:Eu wherein $0.5 < x \leq 1$ or a 2:5:8 nitride phosphor of composition $Ba_{2-x}Sr_xSi_5N_8$:Eu wherein $0 \leq x \leq 2$. It may be that the first and/or second photoluminescence materials comprise narrow-band photoluminescence materials such as narrow-band phosphor materials or quantum (QD) dot materials that generate light having a FWHM ranging from 5 nm to 25 nm. A benefit of using narrow-band photoluminescence materials is an increase in the Gamut Index $R_g$ though this may result in a decrease of Fidelity Index $R_f$.

One or both of the first photoluminescence material and second photoluminescence material can be located remotely to the solid-state excitation source. It may be that the one or both of the first and second photoluminescence materials are located in a package housing the excitation source.

A white light emitting device may comprise: a solid-state excitation source operable to generate blue excitation light; a green photoluminescence material; and a red photoluminescence material, wherein the device may be operable to generate white light with an IEC TM-30 Gamut Index $R_g$ ranging from 105 to 115, and an IEC TM-30 Fidelity Index $R_f$ of ranging from 85 to 95. The device may be configured to be operable to generate white light with an IEC TM-30 Gamut Index $R_g$ ranging from 105 to 110, or from 105 to 108. The device can be configured to be operable to generate white light having an IEC TM-30 Fidelity Index $R_f$ which ranges from 86 to 92. A sum of the Gamut Index $R_g$ and Fidelity Index $R_f$ may be greater than or equal to 194. It may be that a sum of Gamut Index $R_g$ and fidelity Index $R_f$ is greater than or equal to 194 and less than or equal to 197.

The device can be operable to generate white light with a CRI Ra of greater than or equal to 90. The device can be configured to be operable to generate white light having a CRI Ra of from 90 to 97.

The device can be operable to generate white light having a color temperature ranging from 2500K to 5000K.

The device can be operable to generate white light having a chromaticity that ranges from 1 to 3 MacAdam ellipses (SDCM) below the blackbody curve on a CIE 1931 chromaticity diagram.

The device can be operable to generate white light having a CRI R9 of greater than or equal to about 85. The device may be configured to be operable to generate white light having a CRI R12 of from 80 to 95, or from 82 to 93.

It may be that the device is configured to generate white light having a spectrum with a first spectral feature comprising a first local minimum at a first wavelength that ranges from 450 nm to 490 nm, and can be at about 470 nm. It may be that the first spectral feature has an intensity ranging from 38% to 50% of the intensity of the Plankian spectrum at the first wavelength. The device can be configured to generate white light having a spectrum with a second spectral feature comprising a second local minimum or point of inflection at a second wavelength that ranges from 550 nm to 600 nm, and can be about 570 nm. It may be that the second spectral feature has an intensity ranging from 90% to 96% of the intensity of the Plankian spectrum at the second wavelength. Having first and/or second spectral feature can increase the Gamut Index $R_g$ of light generated by the device since the spectrum exhibits more pronounced peaks corresponding to blue, green and red regions of the spectrum.

The solid-state excitation source can be configured to be operable to generate excitation light having a dominant wavelength ranging from 440 nm to 452 nm. Shorter wavelength excitation light can increase the Gamut Index $R_g$ by increasing the depth of the first local minimum. The solid-state excitation source can be operable to generate excitation light having a dominant wavelength ranging from 445 nm to 450 nm and in others ranging from 447 nm to 450 nm.

The green photoluminescence material can generate light having a peak emission wavelength ranging from 500 nm to 530 nm or ranging from 520 nm to 530 nm.

The red photoluminescence material can generate light having a peak emission wavelength ranging from 640 nm to 690 nm or ranging from 650 nm to 670 nm.

It may be that at least one of the green or red photoluminescence materials generate light having a FWHM ranging from 50 nm to 100 nm and can comprise inorganic phosphor materials. The green photoluminescence material can comprise a silicate-based phosphor, or a cerium activated garnet phosphor selected from the group consisting of an yttrium-based YAG phosphor and a lutetium-based LuAG phosphor. The red photoluminescence material can comprise a europium activated nitride-based phosphor selected from the group consisting of $(Ca_{1-x}Sr_x)AlSiN_3$:Eu wherein $0.5 < x \leq 1$, and $Ba_{2-x}Sr_xSi_5N_8$:Eu wherein $0 \leq x \leq 2$. It may be that the one or both of the green or red photoluminescence materials generates light having a FWHM ranging from 5 nm to 25 nm and can comprise narrow-band phosphor materials or quantum (QD) dot materials. A benefit of using narrow-band photoluminescence materials is an increase in the Gamut Index $R_g$ though this will result in a decrease of Fidelity Index $R_f$.

A white light emitting device can comprise: a solid-state excitation source operable to generate blue excitation light; a first photoluminescence material; and a second photoluminescence material, wherein the device is operable to generate white light in which a sum of an IEC TM-30 Gamut Index $R_g$ and an IEC TM-30 Fidelity Index $R_f$ ranges from 194 to 200. It may be that a sum of Gamut Index $R_g$ and fidelity index $R_f$ is greater than or equal to 194 and less than or equal to 197.

The device can be operable to generate white light having a Gamut Index $R_g$ which ranges from 105 to 115. The device may be operable to generate white light with an IEC TM-30 Gamut Index $R_g$ ranging from 105 to 110, or from 105 to 108.

The device can be configured to be operable to generate white light having an Fidelity Index $R_f$ which ranges from 85 to 95. The device can be configured to be operable to generate white light having an IEC TM-30 Fidelity Index $R_f$ which ranges from 86 to 92.

The device can be operable to generate white light having a CRI Ra of greater than or equal to 90. The device can be configured to be operable to generate white light having a CRI Ra of from 90 to 97.

The device can be operable to generate white light having a color temperature ranging from 2500K to 5000K.

The device can be operable to generate white light having a chromaticity that ranges from 1 to 3 MacAdam ellipses (SDCM) lower than the black body curve on a CIE 1931 chromaticity diagram.

The device can be operable to generate white light having a CRI R9 of greater than or equal to about 85.

It may be that the device is configured to generate white light having a spectrum with a first spectral feature comprising a first local minimum at a first wavelength that ranges from 450 nm to 490 nm, and can be at about 470 nm. It may be that the first spectral feature has an intensity ranging from 38% to 50% of the intensity of the Plankian spectrum at the first wavelength. The device can be configured to generate white light having a spectrum with a second spectral feature comprising a second local minimum or point of inflection at a second wavelength that ranges from 550 nm to 600 nm, and can be about 570 nm. It may be that the second spectral feature has an intensity ranging from 90% to 96% of the intensity of the Plankian spectrum at the second wavelength. Having a first and/or second spectral feature can increase the Gamut Index $R_g$ of light generated by the device since the spectrum exhibits more pronounced peaks corresponding to blue, green and red regions of the spectrum.

There is also envisaged use of the light emitting device described herein operable to generate white light with an IEC TM-30 Gamut Index $R_g$ of greater than or equal to 105.

There is also encompassed a method of generating white light with an IEC TM-30 Gamut Index $R_g$ of greater than or equal to 105, the method comprising the steps of: providing a solid-state excitation source operable to generate excitation light having a dominant wavelength ranging from 440 nm to 455 nm; providing a first photoluminescence material which generates light having a peak emission wavelength ranging from 500 nm to 530 nm; providing a second photoluminescence material which generates light having a peak emission wavelength ranging from 640 nm to 690 nm; and exciting said first and second photoluminescence materials with the excitation light.

It may be that the Gamut Index $R_g$ ranges from 105 to 115. The IEC TM-30 Gamut Index $R_g$ may range from 105 to 110, or from 105 to 108.

The IEC TM-30 Fidelity Index $R_f$ may range from 85 to 95. The IEC TM-30 Fidelity Index $R_f$ may range from 86 to 92.

The sum of Gamut Index $R_g$ and Fidelity Index $R_f$ may be greater than or equal to 194. It may be that a sum of Gamut Index $R_g$ and Fidelity Index $R_f$ is greater than or equal to 194 and less than or equal to 197.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1A:
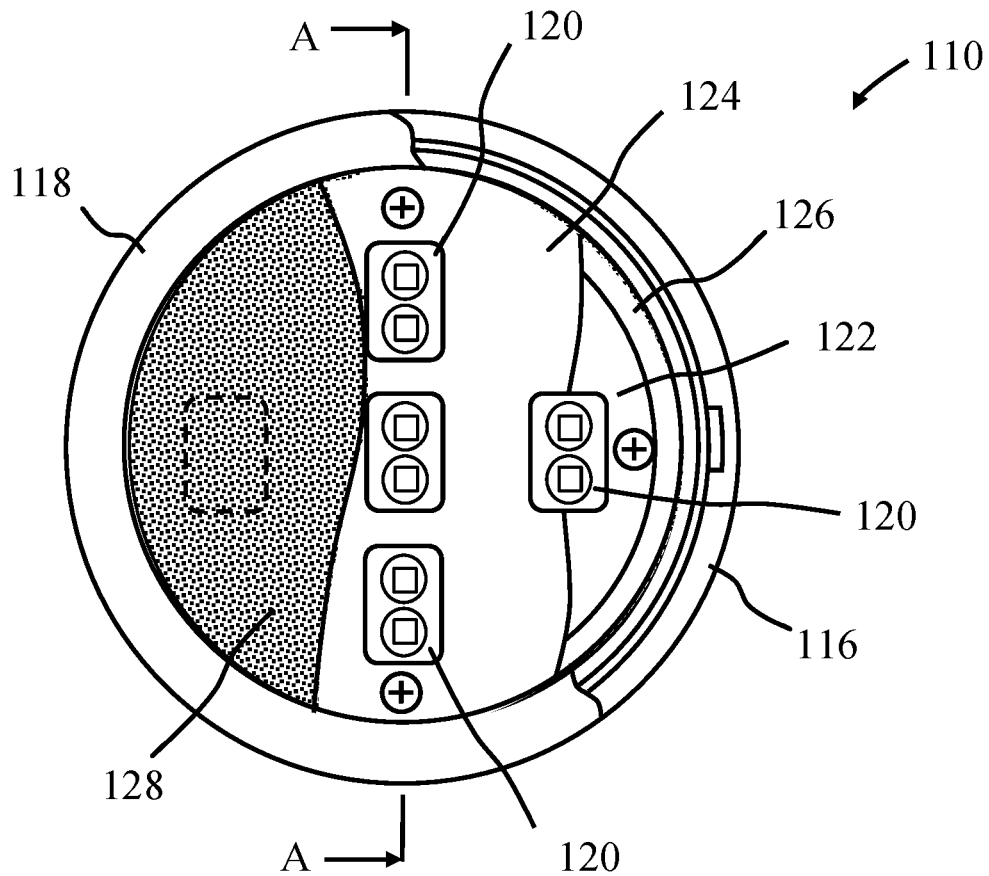
FIGS. 1A and 1B show a remote phosphor solid-state white light emitting device, according to some embodiments.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Throughout this specification, like reference numerals preceded by the figure number are used to denote like features.

Remote Phosphor White Light Emitting Devices

Figure 1B:
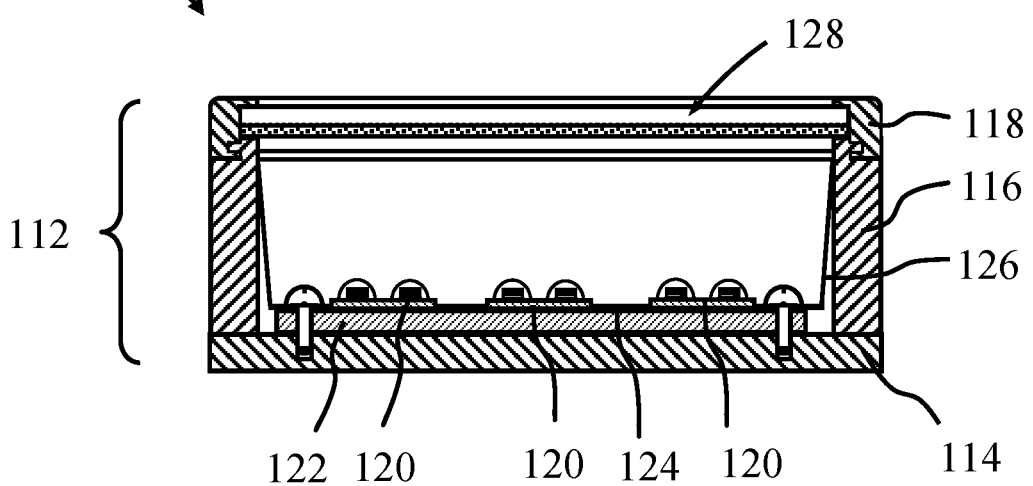

FIGS. 1A and 1B illustrate a remote phosphor solid-state white light emitting device according to an embodiment of the invention in which FIG. 1A is a partial cross-sectional plan view and FIG. 1B is a sectional side view through A-A. The device 110 can be configured to generate white light with a CCT (Correlated Color Temperature) of between 2500K (warm white) and 6500K (cool white) and a Gamut Index $R_g$ of greater than 100, more particularly ranging from 105 to 115. The device can, for example, be used as a stand alone device or be used as a part of a downlight or other lighting arrangement. The device 110 comprises a hollow cylindrical body 112 composed of a circular disc-shaped base 114, a hollow cylindrical wall 116 and a detachable annular top 118. To aid in the dissipation of heat, the base 114 can be fabricated from aluminum, an alloy of aluminum or any material with a high thermal conductivity. The base 114 can be attached to the wall portion 16 by screws or bolts or by other fasteners or by means of an adhesive.

The device 110 further comprises a plurality (five in the example of FIGS. 1A and 1B) of solid-state excitation sources 120 that are mounted in thermal communication with a circular-shaped Metal Core Printed Circuit Board (MCPCB) 122. To maximize the emission of light, the device 110 can further comprise light reflective surfaces 124 and 126 that respectively cover the face of the MCPCB 122 and the inner curved surface of the cylindrical wall 116.

The device 110 further comprises a photoluminescence wavelength conversion component 128 that is located remotely to the excitation sources 120 and absorbs a portion of excitation light 130 generated by the excitation sources 120 and converts it to light of a different wavelength by a process of photoluminescence. The emission product of the device 110 comprises the combined light generated by the excitation sources 120 and photoluminescence light generated by the photoluminescence wavelength conversion component 128. The photoluminescence wavelength conversion component may be formed of a light transmissive material (for example, polycarbonate, acrylic material, silicone material, glass etc.) that incorporates a mixture of a first photoluminescence material which generates light having a peak emission wavelength ranging from 500 nm to 530 nm (that is in the green to yellow region of the visible spectrum) and a second photoluminescence material which generates light having a peak emission wavelength ranging from 640 nm to 690 nm (that is in orange to red region of the visible spectrum). Typically, the photoluminescence materials comprise phosphor materials. Furthermore, in embodiments, the photoluminescence wavelength conversion component may be formed of a light transmissive substrate that is coated with a layer containing the photoluminescence materials. The wavelength conversion component 128 is positioned remotely to the excitation sources 120 and is spatially separated from the excitation sources 120 by an air gap. In this patent specification, "remotely" and "remote" means in a spaced or separated relationship. As illustrated in FIG. 1B, the wavelength conversion component 124 and excitation sources can be separated by air, while in other embodiments they can be separated by a light transmissive medium, such as for example a light transmissive silicone or epoxy material. The wavelength conversion component 128 is configured to completely cover the housing opening such that all light emitted by the device passes through the component 128. As shown the wavelength conversion component 128 can be detachably mounted to the top of the wall portion 116 using the annular top 118 enabling the component and emission color of the lamp to be readily changed.

Figure 2:
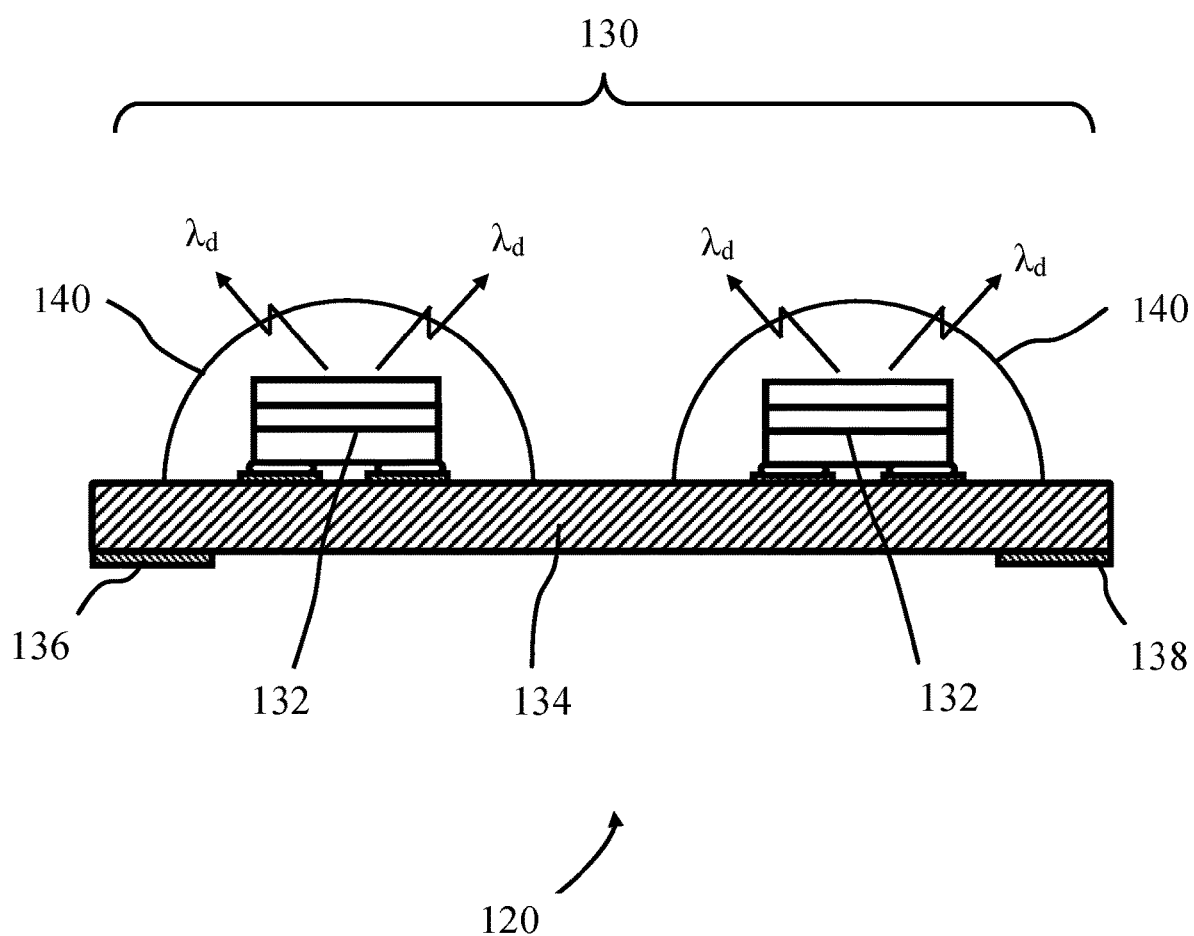
FIG. 2 is a schematic of a solid-state excitation source for use in the light emitting device of FIGS. 1A and 1B.

FIG. 2 is a schematic representation, side view, of a solid-state excitation source 120 that is configured to generate excitation light 130 with a dominant wavelength $\lambda_d$ ranging from 440 nm to 455 nm, that is, in the blue region of the visible spectrum. The excitation source 120 can comprise multiple (two in the example illustrated) solid-state light sources 132; for example, blue-emitting GaN (gallium nitride)-based LED flip-chip dies. The solid-state light sources 132 generate excitation light 132 having a dominant wavelength $\lambda_d$ ranging from 440 nm to 455 nm.

As indicated in FIG. 2, the solid-state excitation source 120 can comprise a COB (Chip On Board) type package in which the LED flip-chip dies 132 are flip-chip bonded on a top face of a ceramic substrate (sub-mount) 134 for example. Electrical contacts 136, 138 can be provided on the bottom face of the substrate 134 for operating the excitation source 120. As shown, the LED flip-chip dies 132 can be encapsulated with a light transmissive optical encapsulant 140, such as for example a silicone or epoxy material.

Figure 3A:
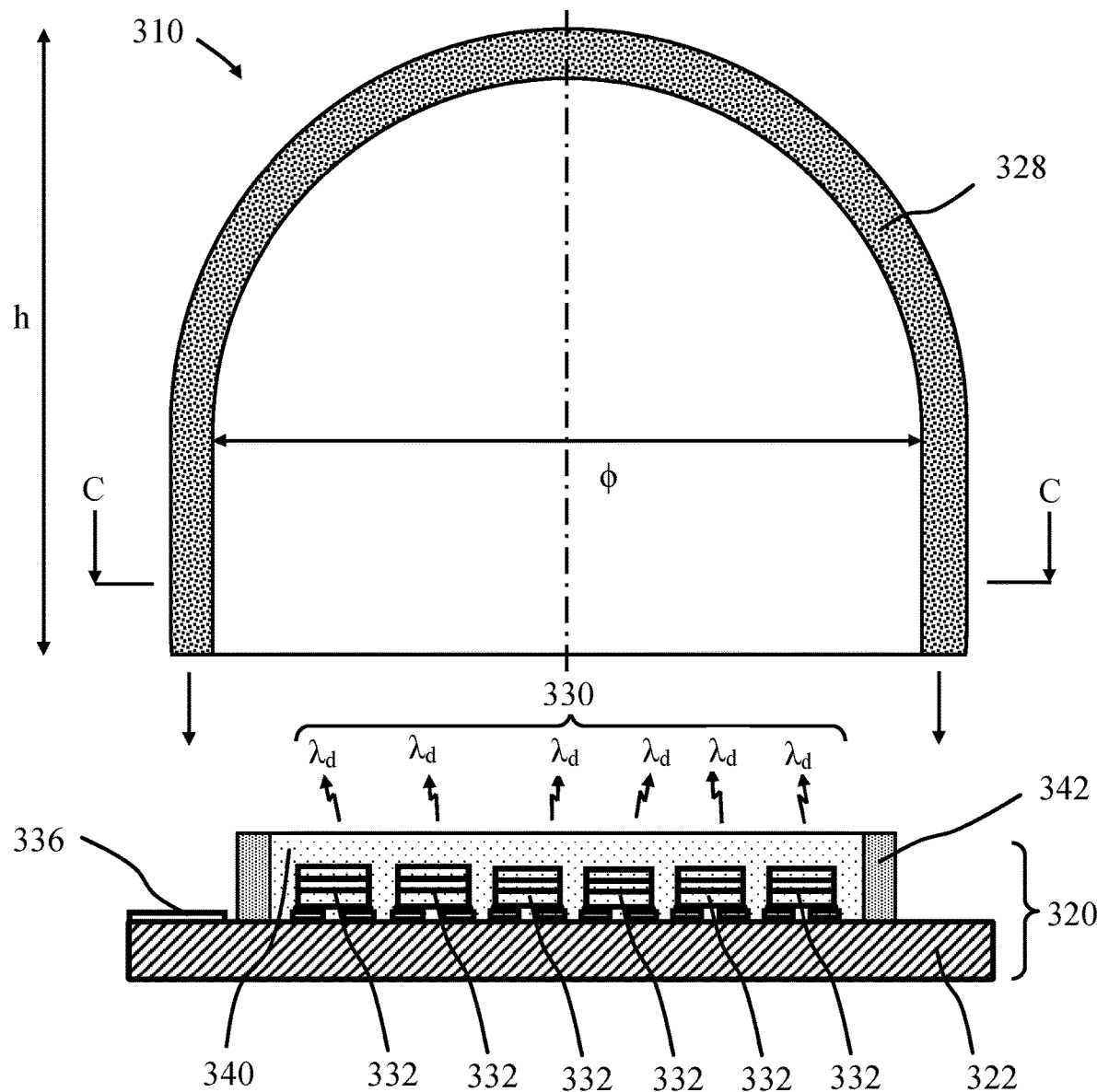
FIGS. 3A and 3B are a schematic representation of a remote phosphor solid-state white light emitting device, according to some embodiments.
Figure 3B:
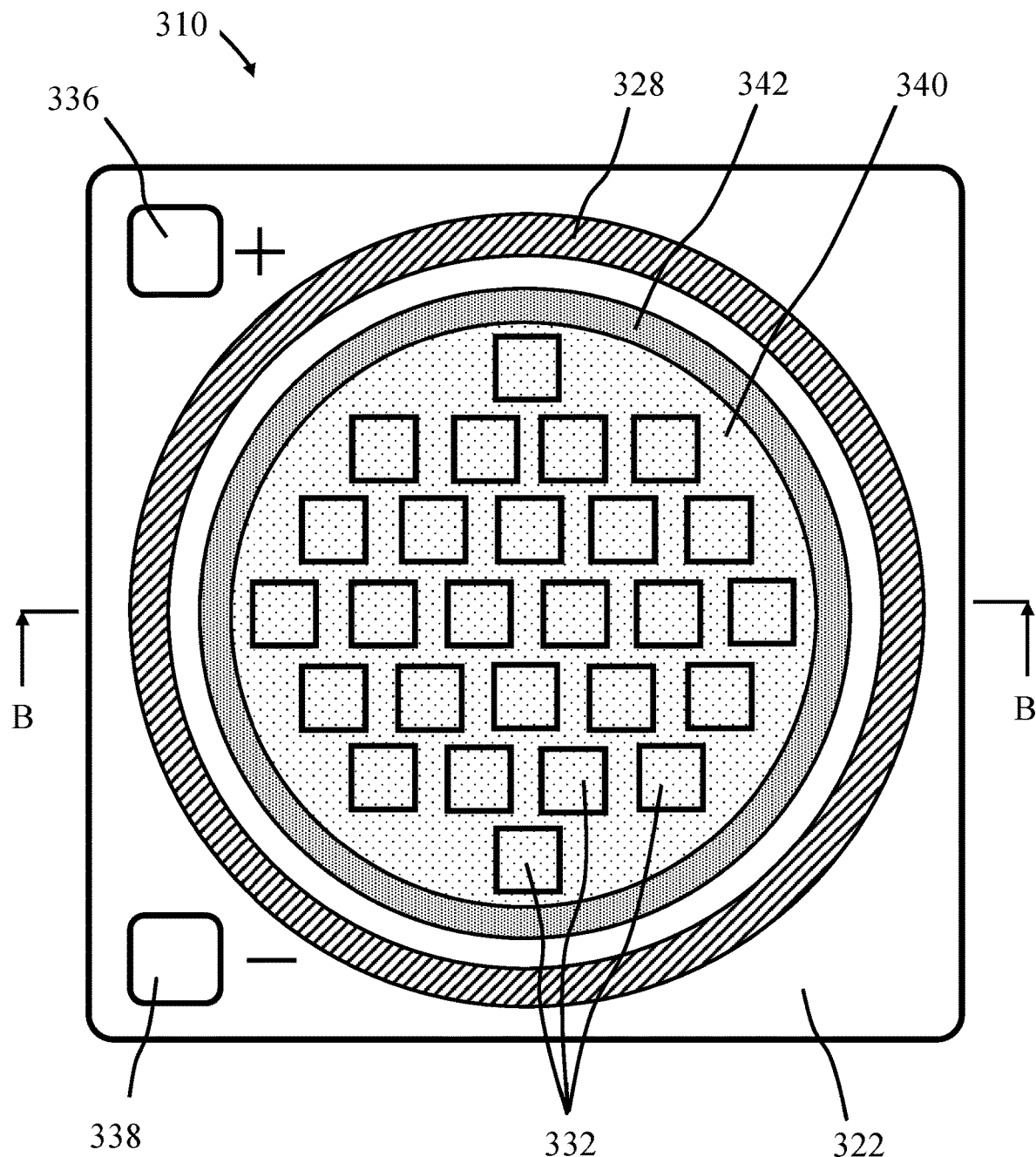

FIGS. 3A and 3B illustrate a further remote phosphor solid-state white light emitting device, according to an embodiment of the invention in which FIG. 3A is an exploded cross-sectional side view through B-B and FIG. 3B is a cross-sectional plan view through C-C. The device 310 can be configured to generate white light with a CCT of between 2500K (warm white) and 5000K (cool white) and a Gamut Index $R_g$ of greater than 100, more typically ranging from 105 to 115.

The device 310 comprises a solid-state excitation source 320 and a photoluminescence wavelength conversion component 328 mounted on the solid-state excitation source 320. To aid in understanding, the wavelength conversion component 328 is illustrated in FIG. 3A in an elevated position above the solid-state excitation source 320. The solid-state excitation source 320 comprises a plurality (twenty six in the example of FIG. 3b) of solid-state light sources 332, for example blue-emitting GaN (gallium nitride)-based LED flip-chip dies, mounted in thermal communication with a square-shaped MCPCB 322. As indicated in FIG. 3B, the excitation sources can be configured as a generally circular array. The solid-state light sources 332 can each generate excitation light 332 having a dominant wavelength $\lambda_d$ ranging from 440 nm to 455 nm. As indicated in FIGS. 3A and 3B, the solid-state excitation source 320 can comprise a COB type package in which the LED flip-chip dies 332 are flip-chip bonded on a top face of the MCPCB 322 for example. Electrical contacts 336, 338 can be provided on the top face of the MCPCB 322 for operating the excitation source 320. As shown, the LED flip-chip dies 332 can be encapsulated with a light transmissive optical encapsulant 340, such as for example a silicone or epoxy material. The light transmissive encapsulant 340 can be contained within an annular-shaped wall 342.

The photoluminescence wavelength conversion component 328 can, as shown, comprise a hollow dome-shaped (hemispherical) component that is configured to be mounted over the plurality of solid-state lights sources 332. In operation, the photoluminescence wavelength conversion component 328 absorbs a portion of the excitation light 330 generated by the excitation sources 320 and convert it to light of a different wavelength by a process of photoluminescence. The emission product of the device 310 comprises the combined light generated by the excitation source 320 and photoluminescence light generated by the photoluminescence wavelength conversion component 328. The photoluminescence wavelength conversion component may be formed of a light transmissive material (for example, polycarbonate, acrylic material, silicone material, glass etc.) that incorporates a mixture of a first photoluminescence material which generates light having a peak emission wavelength ranging from 500 nm to 530 nm (that is in the green region of the visible spectrum) and a second photoluminescence material which generates light having a peak emission wavelength ranging from 640 nm to 690 nm (that is in red region of the visible spectrum). Typically, the photoluminescence materials comprise phosphor materials. Furthermore, in embodiments, the photoluminescence wavelength conversion component may be formed of a light transmissive substrate that is coated with a layer containing the photoluminescence materials. As with the embodiment of FIGS. 1A and 1B, the wavelength conversion component 328 is positioned remotely to the excitation sources 320 with its inner surface being spatially separated from the excitation sources 320 by an air gap. As illustrated in FIG. 3A, the wavelength conversion component and excitation sources can be separated by air, while in other embodiments they can be separated by a light transmissive medium, such as for example a light transmissive silicone or epoxy material. The wavelength conversion component 328 is configured to completely cover the excitation source such that all light emitted by the device passes through the component 328.

Packaged White Light Emitting Devices

Figure 4:
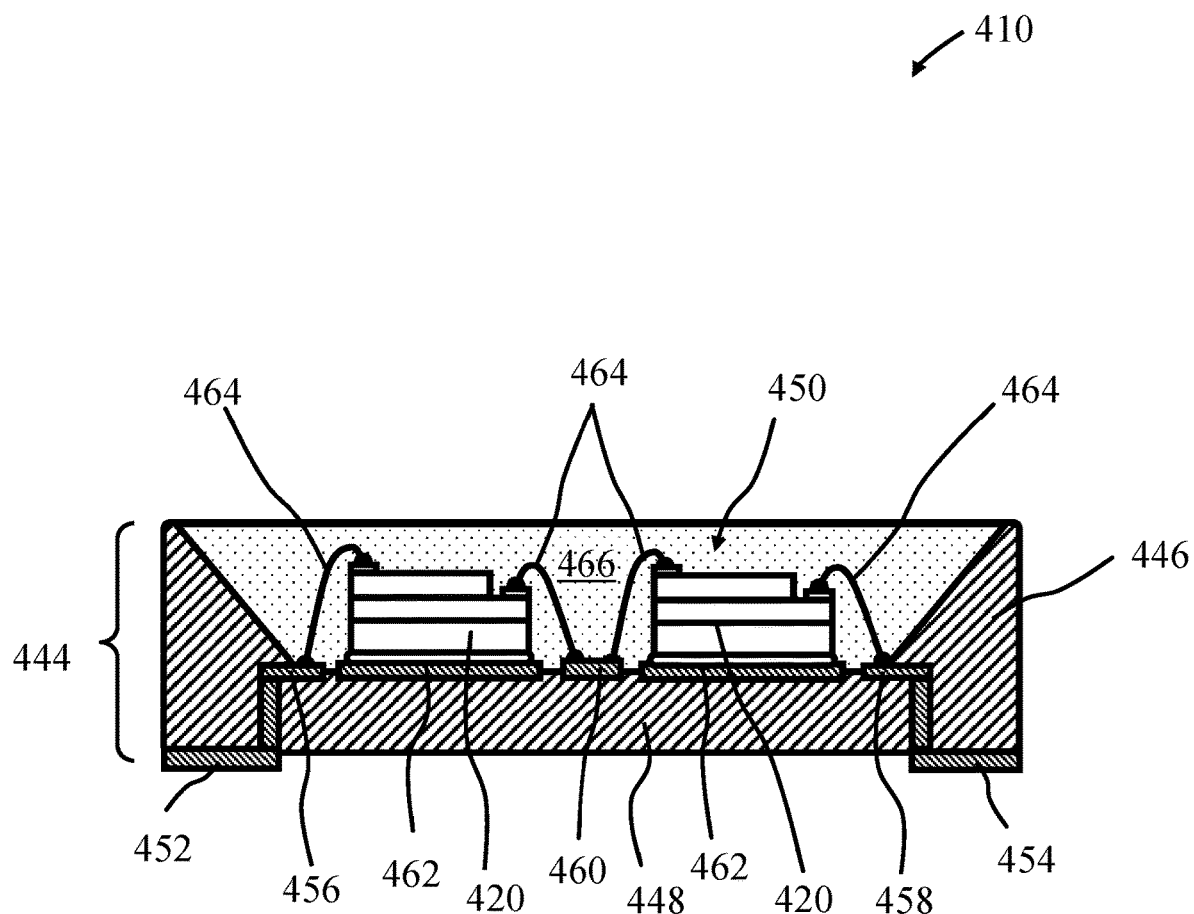
FIG. 4 is a schematic of a solid-state white light emitting device, according to some embodiments.

FIG. 4 is a schematic cross-sectional side view of a white light emitting device 410, according to an embodiment of the invention. The device 410 can be configured to generate white light with a CCT (Correlated Color Temperature) of between 2500K (warm white) and 6500K (cool white) and a Gamut Index $R_g$ of greater than 100, more particularly ranging from 105 to 115.

The device 410 comprises a one or more (two in the example illustrated in FIG. 4) solid-state excitation sources 420 that are configured to generate excitation light with a dominant wavelength $\lambda_d$ ranging from 440 nm to 455 nm, that is, in the blue region of the visible spectrum. As illustrated, the solid-state excitation source(s) 420 can comprise blue-emitting GaN (gallium nitride)-based LED flip-chip dies.

The solid-state excitation sources 420 are housed within a package 444. The package, 444 which can for example comprise Surface Mountable Device (SMD) such as an SMD 2835 LED package, comprising upper body part 446 and base part 448. The upper body part 446 together with the base part 448 defines a recess 450 which is configured to receive the solid-state excitation sources 420. The package 444 further comprises electrical contacts 452 and 454 on an exterior face of the base of the package 444. The electrical contacts 452, 454 can be electrically connected to electrode contact pads 456, 458 and 460 on the floor of the recess 450. The solid-state excitation sources (LED chips) 420 can be mounted to a thermally conductive pad 462 located on the floor of the recess 450 using, for example, adhesive or solder. The LED chip's electrode pads can be electrically connected to corresponding electrode contact pads 456, 458 and 460 on the floor of the package recess 450 using bond wires 464. Alternatively, the LED chips can be flip-chip mounted in and electrically connected to the package. The recess 450 is filled with a light transmissive optical encapsulant 466, typically an optically clear silicone, which is loaded with a mixture of photoluminescence materials such that the exposed surfaces of the solid-state excitation sources (LED chips) 450 are covered by the photoluminescence/silicone material mixture. To enhance the emission brightness of the device, the walls of the upper body part 446/recess 450 can be inclined and comprise a light reflective surface. As described above in relation to remote phosphor white light emitting devices, the photoluminescence/silicone material incorporates a mixture of a first photoluminescence material which generates light having a peak emission wavelength ranging from 500 nm to 530 nm (that is in the green region of the visible spectrum) and a second photoluminescence material which generates light having a peak emission wavelength ranging from 640 nm to 690 nm (that is in red region of the visible spectrum). Typically, the photoluminescence materials comprise phosphor materials.

Green Photoluminescence Materials

In this patent specification, a green photoluminescence material refers to a material which generates light having a peak emission wavelength ($\lambda_{pe}$) ranging from ~500 nm to ~530 nm, that is in the green region of the visible spectrum. Preferably, the green photoluminescence material has a broad emission characteristic and preferably has a FWHM (Full Width Half Maximum) of between about 70 nm and about 120 nm. The green photoluminescence material can comprise any photoluminescence material, such as for example, garnet-based inorganic phosphor materials, silicate phosphor materials and oxynitride phosphor materials. Examples of suitable green phosphors are given in Table 1.

In some embodiments, the green photoluminescence materials comprises a cerium-activated yttrium aluminum garnet phosphor of general composition $Y_3(Al,Ga)_5O_{12}$:Ce (YAG) such as for example a YAG series phosphor from Intematix Corporation, Fremont Calif., USA which have a peak emission wavelength of ranging from 527 nm to 543 nm and a FWHM of ~120 nm. In this patent specification, the notation YAG # represents the phosphor type—YAG—based phosphors—followed by the peak emission wavelength in nanometers (#). For example, YAG535 denotes a YAG phosphor with a peak emission wavelength of 535 nm. The green to yellow photoluminescence material may comprise a cerium-activated yttrium aluminum garnet phosphor of general composition $(Y,Ba)_3(Al,Ga)_5O_{12}$:Ce (YAG) such as for example a GNYAG series phosphor from Intematix Corporation, Fremont Calif., USA. In some embodiments, the green photoluminescence material can comprise an aluminate (LuAG) phosphor of general composition $Lu_3Al_5O_{12}$:Ce (GAL). Examples of such phosphors include for example the GAL series of phosphor from Intematix Corporation, Fremont Calif., USA which have a peak emission wavelength of 516 nm to 560 nm and a FWHM of ~120 nm. In this patent specification, the notation GAL # represents the phosphor type (GAL)-LuAG—based phosphors—followed by the peak emission wavelength in nanometers (#). For example, GAL520 denotes a GAL phosphor with a peak emission wavelength of 520 nm.

Examples of green silicate phosphors include europium activated ortho-silicate phosphors of general composition $(Ba,Sr)_2SiO_4$:Eu such as for example G, EG, Y and EY series of phosphors from Intematix Corporation, Fremont Calif., USA which have a peak emission wavelength ranging from 507 nm to 570 nm and a FWHM of ~70 nm to ~80 nm.

In some embodiments the green to yellow phosphor can comprise a green-emitting oxynitride phosphor as taught in U.S. Pat. No. 8,679,367 entitled "Green-Emitting (Oxy) Nitride-Based Phosphors and Light Emitting Devices Using the Same" which is hereby incorporated in its entirety. Such a green-emitting oxynitride (ON) phosphor can have a general composition $Eu^{2+}:M^{2+}Si_4AlO_xN_{(7-2x/3)}$ where $0.1 \le x \le 1.0$ and $M^{2+}$ is one or more divalent metal selected from the group consisting of Mg, Ca, Sr, Ba, and Zn. In this patent specification, the notation ON # represents the phosphor type (oxynitride) followed by the peak emission wavelength ($\lambda_{pe}$) in nanometers (#). For example ON495 denotes a green oxynitride phosphor with a peak emission wavelength of 495 nm.

TABLE 1

Example Green photoluminescence materials

| Phosphor | General Composition | | Wavelength $\lambda_p$ (nm) |
|---|---|---|---|
| YAG (YAG#) | $Y_{3-x}(Al_{1-y}Ga_y)_5O_{12}$: $Ce_x$ | $0.01 < x < 0.2$ & $0 < y < 2.5$ | 520-550 |
| GNYAG (YAG#) | $(Y,Ba)_{3-x}(Al_{1-y}Ga_y)_5O_{12}$: $Ce_x$ | $0.01 < x < 0.2$ & $0 < y < 2.5$ | 520-550 |
| LuAG (GAL#) | $Lu_{3-x}(Al_{1-y}M_y)_5O_{12}$: $Ce_x$ | $0.01 < x < 0.2$ & $0 < y < 1.5$ M = Mg, Ca, Sr, Ba, Ga, | 500-550 |
| LuAG (GAL#) | $Lu_{3-x}(Al_{1-y}Ga_y)_5O_{12}$: $Ce_x$ | $0.01 < x < 0.2$ & $0 < y < 1.5$ | 500-550 |
| Silicate | $A_2SiO_4$: Eu | A = Mg, Ca, Sr, Ba | 500-550 |
| Silicate | $(Sr_{1-x}Ba_x)_2SiO_4$: Eu | $0.3 < x < 0.9$ | 500-550 |
| Oxynitride (ON#) | $Eu^{2+}$: $M^{2+}Si_4AlO_xN_{(7-2x/3)}$ | $M^{2+}$ = Mg, Ca, Sr, Ba, Zn $0.1 \le x \le 1.0$ | 500-550 |

Red Photoluminescence Materials

The red photoluminescence material can comprise any red photoluminescence material, typically a phosphor, that is excitable by blue light and operable to emit light with a peak emission wavelength $\lambda_p$ ranging from about 640 nm to about 690 nm and can include, for example, a europium activated silicon nitride-based phosphor, α-SiAlON, Group IIA/IIB selenide sulfide-based phosphor or silicate-based phosphors. Examples of red phosphors are given in Table 2.

In some embodiments, the europium activated silicon nitride-based phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$. In this patent specification, the notation CASN # represents the phosphor type (CASN) followed by the peak emission wavelength ($\lambda_{pe}$) in nanometers (#). For example CASN615 denotes an orange to red CASN phosphor with a peak emission wavelength of 615 nm.

In an embodiment, the red phosphor can comprise an red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_b Si_cAl_dN_eEu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/v$ and v is the valence of M.

Alternatively, the red phosphor can comprise a red emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites. An example of one such a phosphor is XR610 red nitride phosphor from Intematix Corporation, Fremont Calif., USA which has a peak emission wavelength of 610 nm.

Red phosphors can also include Group IIA/IM selenide sulfide-based phosphors. A first example of a Group IIA/IM selenide sulfide-based phosphor material has a composition $MSe_{1-x}S_x$:Eu, wherein M is at least one of Mg, Ca, Sr, Ba and Zn and $0 < x < 1.0$. A particular example of this phosphor material is CSS phosphor ($CaSe_{1-x}S_x$:Eu). Details of CSS phosphors are provided in co-pending United States patent application Publication Number US2017/0145309 filed 30 Sep. 2016, which is hereby incorporated by reference in its entirety. The CSS red phosphors described in United States patent publication US2017/0145309 can be used in the present invention. The emission peak wavelength of the CSS phosphor can be tuned from 600 nm to 650 nm by altering the S/Se ratio in the composition and exhibits a narrow-band red emission spectrum with FWHM in the range ~48 nm to ~60 nm (longer peak emission wavelength typically has a larger FWHM value). In this patent specification, the notation CSS # represents the phosphor type (CSS) followed by the peak emission wavelength in nanometers (#). For example, CSS615 denotes a CSS phosphor with a peak emission wavelength of 615 nm. To improve reliability, the CSS phosphor particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition, the narrow-band red phosphor particles may be coated with one or more fluorides, for example: calcium fluoride ($CaF_2$), magnesium fluoride ($MgF_2$), zinc fluoride ($ZnF_2$), aluminum fluoride ($AlF_3$) or titanium fluoride ($TiF_4$). The coatings may be a single layer, or multiple layers with combinations of the aforesaid coatings. The combination coatings may be coatings with an abrupt transition between the first and second materials, or may be coatings in which there is a gradual/smooth transition from the first material to the second material thus forming a zone with mixed composition that varies through the thickness of the coating.

In some embodiments, the red phosphor can comprise an orange-emitting silicate-based phosphor as taught in U.S. Pat. No. 7,655,156 entitled "Silicate-Based Orange Phosphors" which is hereby incorporated in its entirety. Such an orange-emitting silicate-based phosphor can have a general composition $(Sr_{1-x}M_x)_yEu_zSiO_5$ where $0 < x \leq 0.5$, $2.6 \leq y \leq 3.3$, $0.001 \leq z \leq 0.5$ and M is one or more divalent metal selected from the group consisting of Ba, Mg, Ca, and Zn. In this patent specification, the notation O # represents the phosphor type (orange silicate) followed by the peak emission wavelength ($\lambda_{pe}$) in nanometers (#). For example, O600 denotes an orange silicate phosphor with a peak emission wavelength of 600 nm.

TABLE 2

Example red photoluminescence materials

| Phosphor | General Composition | | Wavelength $\lambda_p$ (nm) |
|---|---|---|---|
| CASN (CASN#) | $(Ca_{1-x}Sr_x)AlSiN_3$: Eu | $0.5 < x \leq 1$ | 600-620 |
| 258 nitride | $Ba_{2-x}Sr_xSi_5N_8$: Eu | $0 \leq x \leq 2$ | 580-620 |
| Group IIA/IIB Selenide Sulfide (CSS#) | $MSe_{1-x}S_x$: Eu | M = Mg, Ca, Sr, Ba, Zn $0 < x < 1.0$ | 600-650 |
| CSS (CSS#) | $CaSe_{1-x}S_x$: Eu | $0 < x < 1.0$ | 600-650 |
| Silicate (O#) | $(Sr_{1-x}M_x)_yEu_zSiO_5$ | M = Ba, Mg, Ca, Zn $0 < x \leq 0.5$ $2.6 \leq y \leq 3.3$ $0.001 \leq z \leq 0.5$ | 565-600 |

Nomenclature

In this specification, the following nomenclature is used to denote white light emitting devices: Com. # denotes a comparative white light emitting device and Dev. # denotes a high gamut white light emitting device in accordance with an embodiment of the invention.

Remote Phosphor White Light Emitting Device Test Method

The remote phosphor test method involves measuring total light emission of a remote phosphor white light emitting device (FIGS. 3A and 3B) in an integrating sphere.

The photoluminescence wavelength conversion component (328—FIG. 3A) comprises a 15 mm high (h), 10 mm diameter (φ) silicone dome. The phosphor materials are incorporated in and distributed throughout the dome. The excitation source comprises a 9 mm diameter LED ceramic COB (Chip on board) 1512N COB from Cree Inc, Durham N.C., USA comprising LED chips of dominant wavelength $\lambda_d$=454 nm.

Packaged White Light Emitting Device Test Method

The packaged test method involves measuring total light emission of a packaged white light emitting device (FIG. 4) in an integrating sphere.

Packaged white light emitting devices in accordance with the invention (Dev. #) each comprise a 2835 package devices containing two 1133 LED chips of dominant wavelength $\lambda_d$ (446 nm or 459 nm).

High Gamut White Light Emitting Devices

Table 4 tabulates phosphor compositions for a 2700K nominal color temperature comparative high gamut white light emitting device denoted Com.1 and 2700K, 3000 K, 3500K, and 4000K nominal color temperature high gamut white light emitting devices in accordance with the invention, denoted Dev.1 to Dev.8.

As can be seen from Table 4, in terms of phosphor composition: Com.1 comprises 74.0 wt % YAG540 $((Y,Ba)_{3-x}(Al_{1-y}Ga_y)_5O_{12}:Ce_x$—$\lambda_{pe}$=540 nm), 23.4 wt % CASN650 $(Ca_{1-x}Sr_xAlSiN_3:Eu$-$\lambda_{pe}$=650 nm), and 2.6 wt % CASN628 $(Ca_{1-x}Sr_xAlSiN_3:Eu$-$\lambda_{pe}$=628 nm); Dev.1 comprises 83.5 wt % GAL520 $(Lu_{3-x}(Al_{1-y}Ga_y)_5O_2:Ce_x$—$\lambda_{pe}$=520 nm) and 16.5 wt % CASN650 $(Ca_{1-x}Sr_xAlSiN_3:Eu$-$\lambda_{pe}$=650 nm); Dev.2 comprises 90.3 wt % GAL520 $(Lu_{3-x}(Al_{1-y}Ga_y)_5O_{12}:Ce_x$—$\lambda_{pe}$=520 nm) and 9.7 wt % CASN655 $(Ca_{1-x}Sr_xAlSiN_3:Eu$-$\lambda_{pe}$=655 nm); Dev.3 comprises 84.5 wt % GAL520 $(Lu_{3-x}(Al_{1-y}Ga_y)_5O_{12}:Ce_x$—$\lambda_{pe}$=520 nm) and 15.5 wt % CASN650 $(Ca_{1-x}Sr_xAlSiN_3:Eu$-$\lambda_{pe}$=650 nm); Dev.4 comprises 91.2 wt % GAL520 $(Lu_{3-x}(Al_{1-y}Ga_y)_5O_{12}:Ce_x$—$\lambda_{pe}$=520 nm) and 8.8 wt % CASN655 $(Ca_{1-x}Sr_xAlSiN_3:Eu$-$\lambda_{pe}$=655 nm); Dev.5 comprises 85.5 wt % GAL520 $(Lu_{3-x}(Al_{1-y}Ga_y)_5O_{12}:Ce_x$—$\lambda_{pe}$=520 nm) and 13.5 wt % CASN650 $(Ca_{1-x}Sr_xAlSiN_3:Eu$-$\lambda_{pe}$=650 nm); Dev.6 comprises 92.1 wt % GAL520 $(Lu_{3-x}(Al_{1-y}Ga_y)_5O_{12}:Ce_x$—$\lambda_{pe}$=520 nm) and 7.9 wt % CASN655 $(Ca_{1-x}Sr_xAlSiN_3:Eu$-$\lambda_{pe}$=655 nm); and Dev.7 comprises 86.5 wt % GAL520 $(Lu_{3-x}(Al_{1-y}Ga_y)_5O_{12}:Ce_x$—$\lambda_{pe}$=520 nm) and 13.5 wt % CASN650 $(Ca_{1-x}Sr_xAlSiN_3:Eu$-$\lambda_{pe}$=650 nm); Dev.8 comprises 93.0 wt % GAL520 $(Lu_{3-x}(Al_{1-y}Ga_y)_5O_{12}:Ce_x$—$\lambda_{pe}$=520 nm) and 7.0 wt % CASN655 $(Ca_{1-x}Sr_xAlSiN_3:Eu$-$\lambda_{pe}$=655 nm).

Comparative light emitting device Com.1 is a remote phosphor device as described above while light emitting devices Dev.1 to Dev.8 each comprise 2835 package devices.

Tables 5 and 6 tabulate measured optical test data for the comparative white light emitting device Com.1 and the white light emitting devices Dev.1 to Dev.8.

2700K White Light Emitting Devices

Referring to Tables 5 and 6 and comparing the measured optical data of Dev.2 with comparative device Com.1, it is to be noted that device Dev.2 produces white light having (i) a chromaticity (color point) that is about 1.7 (−1.71) MacAdam ellipses (SDCM—Standard Deviation Color Matching) below (lower than) the blackbody curve (locus) on a CIE 1931 chromaticity diagram compared with about 4 (−3.92) MacAdam ellipses (SDCM) for Com.1, (ii) an IEC TM-30 Gamut Index $R_g$ of about 108 (107.7) compared with about 104 (104.1), (iii) an IEC TM-30 Fidelity Index $R_f$ of about 87 (87.4) compared with about 89 (88.5), (iv) a sum of $R_g+R_f$ of about 195 (195.1) compared with about 193 (192.6), and (v) a CRI R9 (i.e. "Saturated Red") of about 85 (85.2) compared with about 71 (71.1). It is believed that it is a combination of one or more of the above light characteristics (i) to (v) that provides highly desirable and advantageous properties for many retail and other lighting applications.

TABLE 5

Measured optical test data

| Device | $\lambda_d$ (nm) | Lm (lm) | LE (lm/W$_{opt}$) | CIE x | CIE y | CCT (K) | SDCM |
|---|---|---|---|---|---|---|---|
| Com. 1 | 454 | | | 0.4478 | 0.3974 | 2770 | −3.92 |
| Dev. 1 | 450 | 28.2 | 258.4 | 0.4559 | 0.4052 | 2713 | −1.69 |
| Dev. 2 | 447 | 26.3 | 240.1 | 0.4532 | 0.4045 | 2747 | −1.71 |
| Dev. 3 | 450 | 29.5 | 266.9 | 0.4284 | 0.3972 | 3093 | −2.21 |
| Dev. 4 | 447 | 27.7 | 247.0 | 0.4307 | 0.3965 | 3045 | −2.20 |
| Dev. 5 | 450 | 31.3 | 271.7 | 0.4008 | 0.3835 | 3541 | −2.21 |
| Dev. 6 | 447 | 29.9 | 253.6 | 0.4025 | 0.3829 | 3498 | −2.84 |
| Dev. 7 | 450 | 32.7 | 275.9 | 0.3772 | 0.3714 | 4050 | −1.58 |
| Dev. 8 | 447 | 31.6 | 257.9 | 0.3798 | 0.3705 | 3969 | −2.80 |

TABLE 6

Measured optical test data

| Device | IES TM-30-15 | | | CIE Color Rendering CRI | | | | |
|---|---|---|---|---|---|---|---|---|
| | $R_g$ | $R_f$ | $R_g + R_f$ | R8 | R9 | R12 | Ra | Rall |
| Com. 1 | 104.1 | 88.5 | 192.6 | 86.8 | 71.1 | 83.5 | 93.5 | 91.2 |
| Dev. 1 | 105.8 | 90.7 | 196.5 | 96.4 | 95.9 | 92.4 | 96.1 | 95.5 |
| Dev. 2 | 107.7 | 87.4 | 195.1 | 89.6 | 85.2 | 84.6 | 93.2 | 92.0 |
| Dev. 3 | 105.6 | 91.1 | 196.7 | 95.5 | 96.7 | 91.7 | 95.4 | 95.0 |

TABLE 4

White light emitting device phosphor composition

| Device | Nominal Color Temperature (K) | Phosphor composition (wt. %) | | | | |
|---|---|---|---|---|---|---|
| | | Green | | Red | | |
| | | YAG540 | GAL520 | CASN628 | CASN650 | CASN655 |
| Com. 1 | 2700 | 74.0 | — | 2.6 | 23.4 | — |
| Dev. 1 | 2700 | — | 83.5 | — | 16.5 | — |
| Dev. 2 | 2700 | — | 90.3 | — | — | 9.7 |
| Dev. 3 | 3000 | — | 84.5 | — | 15.5 | — |
| Dev. 4 | 3000 | — | 91.2 | — | — | 8.8 |
| Dev. 5 | 3500 | — | 85.5 | — | 14.5 | — |
| Dev. 6 | 3500 | — | 92.1 | — | — | 7.9 |
| Dev. 7 | 4000 | — | 86.5 | — | 13.5 | — |
| Dev. 8 | 4000 | — | 93.0 | — | — | 7.0 |

TABLE 6-continued

Measured optical test data

| Device | IES TM-30-15 | | | CIE Color Rendering CRI | | | | |
|---|---|---|---|---|---|---|---|---|
| | $R_g$ | $R_f$ | $R_g + R_f$ | R8 | R9 | R12 | Ra | Rall |
| Dev. 4 | 107.8 | 87.6 | 195.4 | 88.8 | 84.6 | 85.5 | 92.7 | 91.6 |
| Dev. 5 | 105.4 | 90.9 | 195.3 | 94.6 | 97.2 | 89.9 | 94.6 | 94.2 |
| Dev. 6 | 107.7 | 87.5 | 195.2 | 88.3 | 85.3 | 85.9 | 91.9 | 91.1 |

TABLE 6-continued

Measured optical test data

| | IES TM-30-15 | | | CIE Color Rendering CRI | | | | |
|---|---|---|---|---|---|---|---|---|
| Device | $R_g$ | $R_f$ | $R_g + R_f$ | R8 | R9 | R12 | Ra | Rall |
| Dev. 7 | 105.0 | 89.8 | 194.8 | 93.3 | 93.0 | 84.9 | 92.8 | 91.9 |
| Dev. 8 | 107.6 | 86.5 | 194.1 | 87.8 | 88.6 | 82.8 | 90.7 | 90.0 |

Figure 5:
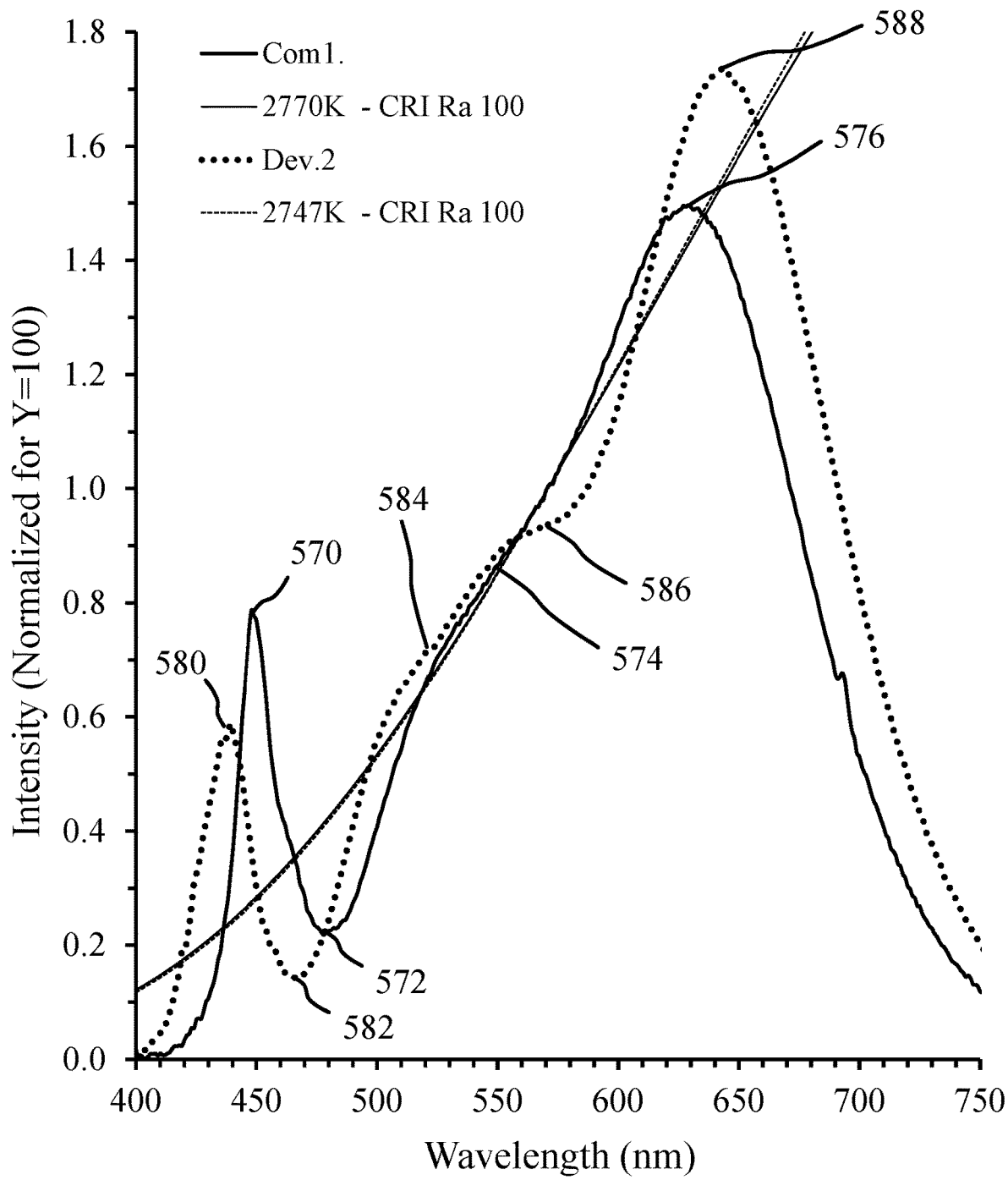
FIG. 5 shows emission spectra, normalized intensity (normalized to a CIE 1931 XYZ relative luminance Y=100) versus wavelength (nm) for (i) Com. 1 (thick solid line), (ii) Dev.2 (heavy dotted line), (iii) Plankian (blackbody) radiator (thin solid line) of temperature T that is the same as the CCT of Com.1 (2770K), and (iv) Plankian (blackbody) radiator (light dotted line) of temperature T that is the same as the CCT of Dev.2 (2747K)

FIG. 5 shows emission spectra, normalized intensity versus wavelength (nm) for (i) comparative light emitting device Com. 1 (thick solid line), (ii) light emitting device Dev.2 (heavy dotted line), (iii) Plankian (blackbody) radiator (thin solid line) of temperature T that is the same as the CCT of Com.1 (2770 K), and (iv) Plankian (blackbody) radiator (light dotted line) of temperature T that is the same as the CCT of Dev.2 (2747 K). To make a meaningful comparison of the spectra, each spectrum has been normalized such each has a CIE 1931 XYZ relative luminance Y=100. The data are normalized using the CIE 1931 luminosity function y(λ) of a standard observer which takes account of the photopic response of an observer. The Plankian (blackbody) spectrum for a given temperature T corresponds to a CIE General CRI (Ra), IES TM-30-15 Gamut Index $R_g$ and Fidelity Index $R_f$ equal to 100 for that temperature.

Referring to FIG. 5, the emission spectrum for Com.1 (thick solid line) exhibits, in order from shorter wavelengths to longer wavelengths, general spectral characteristics: (i) a first peak 570 at a peak emission wavelength $\lambda_{pe}$=448 nm whose intensity I is greater than the intensity of the corresponding Plankian spectrum P.S. (thin solid line) for wavelengths between 437 nm and 465 nm (Δλ for I>P.S.), (ii) a local minima (trough) 572 at a wavelength $\lambda_{min}$=478 nm with an intensity I of 52% of the corresponding Plankian spectrum (I % of P.S. at $\lambda_{min}$) and an intensity I that is less than that of the corresponding Plankian spectrum P.S. for wavelengths between 451 nm and 498 nm (Δλ for I<P.S.), (iii) a region 574 between 520 nm and 580 nm with an intensity I that generally corresponds (within about 1%-99% to 101%) with the Plankian spectrum P.S., and (iv) a second peak 576 at a peak emission wavelength $\lambda_{pe}$=628 nm whose intensity I is greater than the Plankian spectrum P.S. for wavelengths between 580 nm and 637 nm (αλ for I>P.S.) and is 104% of the Plankian Spectrum P.S. at the peak emission wavelength (I % of P.S. at $\lambda_{pe}$). In comparison, the emission spectrum (heavy dotted line) for Dev.2 in accordance with the invention, exhibits, in order from shorter wavelengths to longer wavelengths, general spectral characteristics: (i) a first peak 580 at a peak emission wavelength $\lambda_{pe}$=439 nm whose intensity I is greater than that of the corresponding Plankian spectrum P.S. (light dotted line) for wavelengths between 419 nm and 450 nm (Δλ for I>P.S.), (ii) a first spectral feature (local minima or trough) 582 at a first wavelength $\lambda_1$=467 nm with an intensity I of 39% of the Plankian spectrum P.S. at $\lambda_1$ (I % of P.S. at $\lambda_1$) and an intensity I that is lower than the Plankian spectrum P.S. over a wavelength range 451 nm to 498 nm (Δλ for I<P.S.), (iii) a region 584 having an intensity I that is greater than the intensity of the Plankian spectrum P.S. (I % of P.S. 105-112%) for wavelength between 497 nm and 560 nm (Δλ for I>P.S.), (iv) a second spectral feature (point of inflection) 586 at a second wavelength $\lambda_2$=about 570 nm with an intensity I of 94% of the Plankian spectrum P.S. at $\lambda_2$ (I % of P.S. at $\lambda_2$) and an intensity I that is lower than the Plankian spectrum P.S. over a wavelength range 561 nm to 607 nm (Δλ for I<P.S.), and (v) a second peak 588 at a peak emission wavelength $\lambda_{pe}$=644 nm whose intensity I is greater than the Plankian spectrum P.S. for wavelengths between 608 nm and 656 nm (Δλ for I>P.S.) and is 111% of the Plankian Spectrum P.S. at the peak emission wavelength (I % of P.S. at $\lambda_{pe}$).

Table 7 tabulates measured spectral characteristics for the comparative white light emitting device Com.1 and Tables 8 and 9 tabulates measured spectral characteristics for the white light emitting devices Dev.1 to Dev.8.

It is believed that a combination of one or more of: (i) the peak emission wavelength $\lambda_{pe}$ and/or intensity of the first peak 580, (ii) the wavelength $\lambda_1$ and/or intensity of the first spectral feature (local minima/trough) 582, (iii) the range of wavelengths that the first spectral feature 582 has an intensity less than the Plankian spectrum (iv) the range of wavelengths and/or intensity of the region 584 which exceeds the black body spectrum, (v) the wavelength and/or intensity of the second spectral feature 586 (point of inflection), (vi) the range of wavelengths that the second spectral feature 586 has an intensity that is less than the Plankian Spectrum, and (vii) the wavelength $\lambda_2$ and/or intensity of the second peak 588 and the amount by which it exceeds the Plankian Spectrum that results in the desirable optical characteristics discussed above. For example, it is to be noted that using excitation light with a shorter dominant wavelength $\lambda_d$ (447 nm for Dev.2 compared with 454 nm for Com.1—Table 5) shifts the peak emission wavelength $\lambda_{pe}$ of the first peak 580 to shorter wavelengths (439 nm compared with 448 nm—Tables 7 and 8) which results in a deepening (reduction in intensity I at $\lambda_1$) of the first spectral feature (trough) 582 relative to the Plankian spectrum (39% of P.S. compared with 52%—Tables 7 and 8). Moreover, using a green phosphor having a shorter peak emission wavelength $\lambda_{pe}$ (520 nm for Dev.2 compared with 540 nm for Com.1—Table 4) and/or a red phosphor having a longer peak emission wavelength $\lambda_{pe}$ (650 nm compared with 628 nm—Table 4) can have a twofold effect on the spectral characteristics. First, use of a green phosphor with a shorter peak emission wavelength has the effect of shifting the region 584 to shorter wavelengths (497 nm-560 nm compared with 520 nm-580 nm—Tables 7 and 9). Furthermore, by using a higher proportion of green phosphor of the total phosphor content (90.1% compared with 78%—Table 4) this results in the intensity within the region 584 exceeding the Plankian spectrum (105% to 112% compared with 99% to 101%) and it is believed that this results in an increase in Gamut Index $R_g$ (108 compared with 104—Table 6). Second, use of a green phosphor with a shorter peak emission wavelength in combination with a red phosphor with a longer peak emission wavelength is believed to result in the development of the second spectral feature 586 whose intensity I drops below the Plankian spectrum (<P.S.) over a wavelength range 561 nm to 607 nm (Δλ for I<P. S)—Table 9. Furthermore, use of a red phosphor with a longer peak emission wavelength $\lambda_{pe}$ is believed to result in the increase in CRI R9 (85 compared with 71—Table 6).

TABLE 7

Measured spectral characteristics (P.S. = Plankian Spectrum)

| | 1st Peak 70 | | 1st feature (local minima) 72 | | Region 74 | | | 2nd Peak 76 | |
|---|---|---|---|---|---|---|---|---|---|
| Device | $\lambda_{pe}$ (nm) | Δλ for I > P.S. (nm) | $\lambda_{min}$ (nm) | I % of P.S. at $\lambda_{min}$ | Δλ for I < P.S. (nm) | Δλ for I > P.S. (nm) | I % of P.S. over Δλ | $\lambda_{pe}$ (nm) | Δλ for I > P.S. (nm) | I % of P.S. at $\lambda_{pe}$ |
| Com. 1 | 448 | 437-465 | 478 | 52 | 466-520 | 520-580 | 99-101 | 628 | 580-637 | 104 |

TABLE 8

Measured spectral characteristics (P.S. = Plankian Spectrum)

| | 1st Peak 80 | | 1st feature 82 | | Region 84 | | |
|---|---|---|---|---|---|---|---|
| Device | $\lambda_{pe}$ (nm) | Δλ for I > P.S. (nm) | $\lambda_1$ (nm) | I % of P.S. at $\lambda_1$ | Δλ for I < P.S. (nm) | Δλ for I > P.S. (nm) | I % of P.S. over Δλ |
| Dev. 1 | 443 | 425-453 | 468 | 47 | 454-497 | 498-555 | 105-110 |
| Dev. 2 | 439 | 419-450 | 467 | 39 | 451-498 | 497-560 | 105-112 |
| Dev. 3 | 442 | 426-454 | 469 | 47 | 455-501 | 502-561 | 103-105 |
| Dev. 4 | 439 | 421-451 | 468 | 41 | 452-498 | 499-561 | 103-108 |
| Dev. 5 | 444 | 428-454 | 470 | 49 | 455-504 | 505-563 | 103-105 |
| Dev. 6 | 439 | 422-452 | 469 | 41 | 453-501 | 502-564 | 103-106 |
| Dev. 7 | 444 | 429-454 | 471 | 44 | 455-507 | 508-568 | 102-106 |
| Dev. 8 | 439 | 423-451 | 469 | 38 | 452-504 | 505-568 | 102-107 |

TABLE 9

Measured spectral characteristics (P.S. = Plankian Spectrum)

| | 2nd Feature 86 | | | 2nd Peak 88 | | |
|---|---|---|---|---|---|---|
| Device | $\lambda_2$ (nm) | I % of P.S. at $\lambda_2$ | Δλ for I < P.S. (nm) | $\lambda_{pe}$ (nm) | Δλ for I > P.S. (nm) | I % of P.S. at $\lambda_{pe}$ |
| Dev. 1 | 570 | 96 | 556-600 | 634 | 601-646 | 111 |
| Dev. 2 | 570 | 94 | 561-607 | 644 | 608-656 | 111 |
| Dev. 3 | 570 | 96 | 562-602 | 634 | 603-646 | 108 |
| Dev. 4 | 570 | 95 | 562-608 | 642 | 609-656 | 109 |
| Dev. 5 | 575 | 95 | 564-602 | 635 | 603-647 | 107 |
| Dev. 6 | 582 | 91 | 565-609 | 643 | 610-659 | 112 |
| Dev. 7 | 581 | 95 | 569-605 | 631 | 606-646 | 106 |
| Dev. 8 | 589 | 93 | 569-610 | 641 | 611-659 | 112 |

Comparing devices Dev.1 and Dev.2. Both Dev.1 and Dev.2 are configured to generate white light of nominal CCT of 2700K. The physical differences between Dev.2 and Dev.1 are: (i) the excitation light of Dev.2 is of a shorter dominant wavelength ($\lambda_{pe}$=447 nm compared with 450 nm), (ii) has a higher proportion of green phosphor (90.3% compared with 83.5%), and (iii) the red phosphor has a longer peak emission wavelength ($\lambda_{pe}$=655 nm compared with 650 nm)—Tables 4 and 5. As indicated in Table 6 these physical differences result in (i) an increase in Gamut Index $R_g$ (107.7 compared with 105.8), (ii) a decrease in Fidelity Index $R_f$ (87.4 compared with 90.7), (iii) a small decrease in the sum of $R_g+R_f$ (195.1 compared with 196.5), (iv) a decrease in CRI R9 (85.2 compared with 95.9), and (v) a decrease in CRI Ra (93.2 compared with 96.1). It is to be noted that while the 4% increase in Gamut Index $R_g$ may result in a 7% reduction luminous efficacy LE (240.1 lm/$W_{opt}$ compared with 258.4 lm/$W_{opt}$), Dev.2 still has a high luminous efficacy LE of about 240 lm/$W_{opt}$.

Figure 6:
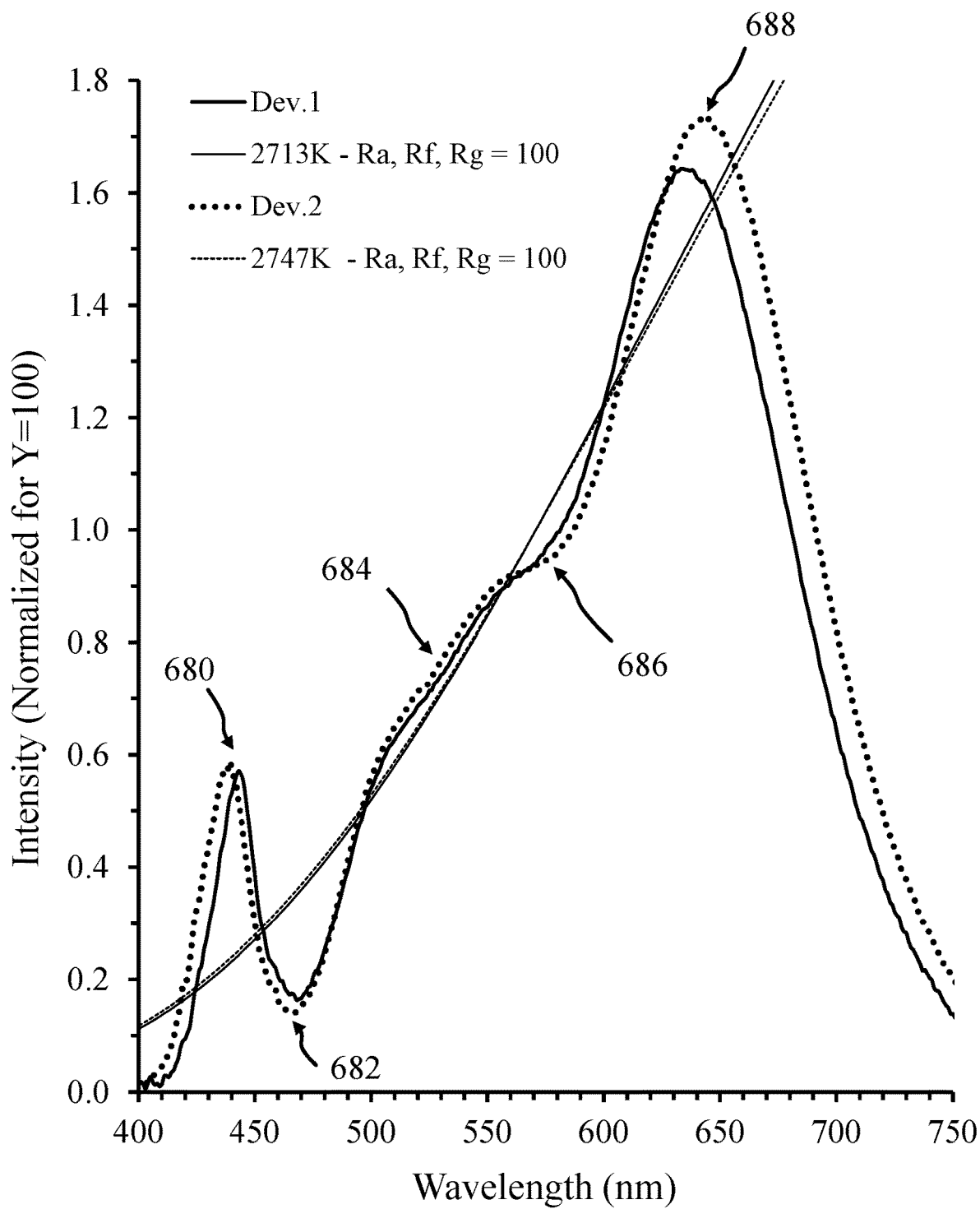
FIG. 6 shows emission spectra, normalized intensity (normalized to a CIE 1931 XYZ relative luminance Y=100) versus wavelength (nm) for (i) Dev. 1 (thick solid line), (ii) Dev.2 (heavy dotted line), (iii) Plankian (blackbody) radiator (thin solid line) of temperature T that is the same as the CCT of Dev.1 (2713K), and (iv) Plankian (blackbody) radiator (light dotted line) of temperature T that is the same as the CCT of Dev. 2 (2747K)

FIG. 6 shows emission spectra, normalized intensity versus wavelength (nm) for (i) Dev. 1 (thick solid line), (ii) Dev.2 (heavy dotted line), (iii) Plankian radiator (thin solid line) of temperature T that is the same as the CCT of Dev.1 (2713K), and (iv) Plankian radiator (light dotted line) of temperature T that is the same as the CCT of Dev. 2 (2747K).

As indicated in FIG. 6 and Tables 8 and 9, the effect on the spectral characteristics of light generated by Dev.1 and Dev.2 due to the physical differences between the devices are notably: (i) a reduction in peak emission wavelength $\lambda_{pe}$ (439 nm compared with 443 nm) of the first peak 680, (ii) a small decrease in the wavelength $\lambda_1$ (467 nm compared with 468 nm) of the first spectral feature (local minima or trough) 682, (iii) an increase in the depth (reduction in intensity I) of the first spectral feature 682 relative to the Plankian spectrum (I % of P.S. at $\lambda_1$: 39% compared with 47%), (iv) a small shift (3 nm) to shorter wavelengths of the wavelength range Δλ for which the intensity I of the first spectral feature 682 is less than the intensity of the P.S. (Δλ for I<P.S.: 451-498 nm compared with 454-497 nm), (v) an increase in the amount by which the intensity of region 684 exceeds the Plankian spectrum (I % of P.S.: 105-112% compared with 105-110%), (vi) an increase in the depth (reduction in intensity I) of the second spectral feature (point of inflection) 686 relative to the Plankian spectrum (I % of P.S. at $\lambda_2$: 94% compared with 96%), (vii) a small shift (5 nm) to longer wavelengths of the wavelength range Δλ for which the intensity I of the second spectral feature 686 is less than the intensity of the Plankian spectrum P.S. (Δλ for I<P.S.: 561-607 nm compared with 556-600 nm), and (viii) an increase in peak emission wavelength $\lambda_{pe}$ of the second peak 688 (643 nm compared with 634 nm).

As described above, using excitation light with a shorter dominant wavelength $\lambda_d$ shifts the peak emission wavelength $\lambda_{pe}$ of the first peak 680 to shorter wavelengths and results in the decrease in intensity (deepening) of the first spectral feature (trough) 682. Moreover, using a higher proportion of green phosphor of total phosphor content and/or a red phosphor having a longer peak emission wavelength $\lambda_{pe}$ can have a twofold effect on the spectral characteristics. First, having a higher proportion of green phosphor results in an increase in the amount the intensity within the region 684 exceeds the Plankian spectrum and it is believed that this results in an increase in Gamut Index $R_g$. Second, use of a red phosphor with a longer peak emission wavelength is believed to result in the second spectral feature 686 having an intensity that drops further below the Plankian spectrum and this may account for the decrease in CRI R9.

3000K White Light Emitting Devices

Both devices Dev.3 and Dev.4 are configured to generate white light of nominal CCT of 3000K. As with devices Dev.1 and Dev.2, the physical differences between Dev.4 and Dev.3 are: (i) the excitation light of Dev.4 is of a shorter dominant wavelength ($\lambda_d$=447 nm compared with 450 nm), (ii) a higher proportion of green phosphor (91.2% compared with 84.5%), and (iii) the red phosphor has a longer peak emission wavelength ($\lambda_{pe}$=655 nm compared with 650 nm)—Tables 4 and 5.

As indicated in Table 6, these physical differences result in (i) an increase in Gamut Index $R_g$ (107.8 compared with 105.6), (ii) a decrease in Fidelity Index $R_f$ (87.6 compared with 91.1), (iii) a small decrease in the sum of $R_g+R_f$ (195.4 compared with 196.7), (iv) a decrease in CRI R9 (84.6 compared with 96.7), and (v) a decrease in CRI Ra (92.7 compared with 95.4). It is to be noted that while the 2% increase in Gamut Index $R_g$ may result a 7% reduction luminous efficacy LE (247.0 lm/$W_{opt}$ compared with 266.9 lm/$W_{opt}$), Dev.4 still has a high luminous efficacy LE of 247 lm/$W_{opt}$.

Figure 7:
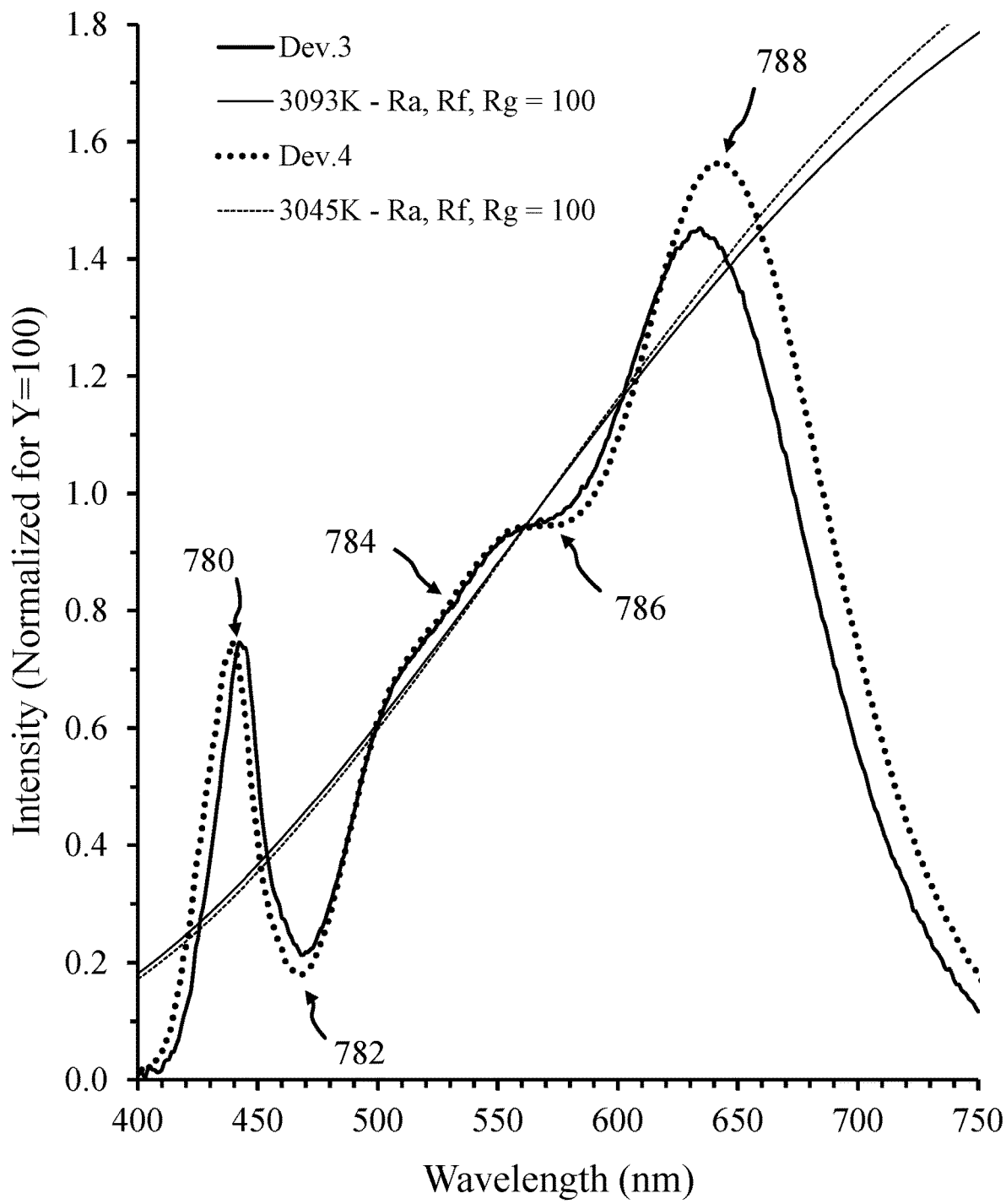
FIG. 7 shows emission spectra, normalized intensity (normalized to a CIE 1931 XYZ relative luminance Y=100) versus wavelength (nm) for (i) Dev.3 (thick solid line), (ii) Dev.4 (heavy dotted line), (iii) Plankian (blackbody) radiator (thin solid line) of temperature T that is the same as the CCT of Dev.3 (3093K), and (iv) Plankian (blackbody) radiator (light dotted line) of temperature T that is the same as the CCT of Dev.4 (3045K)

FIG. 7 shows emission spectra, normalized intensity versus wavelength (nm) for (i) Dev. 3 (thick solid line), (ii) Dev.4 (heavy dotted line), (iii) Plankian (blackbody) radiator (thin solid line) of temperature T that is the same as the CCT of Dev.3 (3093K), and (iv) Plankian (blackbody) radiator (light dotted line) of temperature T that is the same as the CCT of Dev. 4 (3045K).

As indicated in FIG. 7 and Tables 8 and 9, the effect on the spectral characteristics of light generated by Dev.3 and Dev.4 due to the physical differences between the devices are notably: (i) a reduction in peak emission wavelength $\lambda_{pe}$ (439 nm compared with 442 nm) of the first peak 780, (ii) a small decrease in the wavelength $\lambda_1$ (468 nm compared with 469 nm) of the first spectral feature (local minima or trough) 782, (iii) an increase in the depth (reduction in intensity I) of the first spectral feature 782 relative to the Plankian spectrum (I % of P.S. at $\lambda_1$: 41% compared with 47%), (iv) a small shift (3 nm) to shorter wavelengths of the wavelength range $\Delta\lambda$ for which the intensity I of the first spectral feature 782 is less than the intensity of the Plankian spectrum ($\Delta\lambda$ for I>P.S.: 452-498 nm compared with 455-501 nm), (v) an increase in the amount by which the intensity of region 784 exceeds the Plankian spectrum (I % of P.S.: 103-108% compared with 103-105%), (vi) an increase in the depth (reduction in intensity I) of the second spectral feature (point of inflection) 786 relative to the Plankian spectrum (I % of P.S. at $\lambda_2$: 95% compared with 96%), (vii) a small increase in the wavelength range $\Delta\lambda$ for which the intensity I of the second spectral feature 786 is less than the intensity of the P.S. ($\Delta\lambda$ for I<P.S.: 562-608 nm compared with 562-602 nm), and (viii) an increase in peak emission wavelength $\pi_{pe}$ of the second peak 788 (642 nm compared with 634 nm). It should also be noted that the second spectral feature 786 for Dev.4 is developing into a local minima (trough).

As described above, using excitation light with a shorter dominant wavelength $\lambda_d$ shifts the peak emission wavelength $\lambda_{pe}$ of the first peak 780 to shorter wavelengths and results in the decrease in intensity of the first spectral feature (trough) 782. Moreover, using a higher proportion of green phosphor of total phosphor content and/or a red phosphor having a longer peak emission wavelength $\lambda_{pe}$ can have a twofold effect on the spectral characteristics. First, having a higher proportion of green phosphor results in an increase in the amount the intensity within the region 784 exceeds the Plankian spectrum and it is believed that this results in an increase in Gamut Index $R_g$. Second, use of a red phosphor with a longer peak emission wavelength is believed to result in the second spectral feature 786 having an intensity that drops further below the Plankian spectrum and this may account for the decrease in CRI R9.

Referring to Tables 5 and 6 it is to be noted that devices Dev.3 and Dev.4 produce white light having (i) a respective chromaticity of about 2.2 (−2.21) and about 2.2 (−2.20) MacAdam ellipses (SDCM—Standard Deviation Color Matching) below (lower than) the blackbody curve (locus) on a CIE 1931 chromaticity diagram, (ii) a respective IEC TM-30 Gamut Index $R_g$ of about 106 (105.6) and about 108 (107.8), (iii) a respective IEC TM-30 Fidelity Index $R_f$ of about 91 (91.1) and about 88 (87.6), (iv) a respective sum of $R_g+R_f$ of about 197 (196.7) and about 195 (195.4), and (v) a respective CRI R9 of about 97 (96.7) and about 85 (84.6).

3500K White Light Emitting Devices

Both devices Dev.5 and Dev.6 are configured to generate white light of nominal CCT of 3500K. As with devices Dev.1 and Dev.2 and devices Dev.3 and Dev.4, the physical differences between Dev.6 and Dev.5 are: (i) the excitation light of Dev.6 is of a shorter dominant wavelength ($\lambda_d$=447 nm compared with 450 nm), (ii) a higher proportion of green phosphor (92.1% compared with 85.5%), and (iii) the red phosphor has a longer peak emission wavelength ($\lambda_{pe}$=655 nm compared with 650 nm)—Tables 4 and 5.

As indicated in Table 6 these physical differences result in (i) an increase in Gamut Index $R_g$ (107.7 compared with 105.4), (ii) a decrease in Fidelity Index $R_f$ (87.5 compared with 90.9), (iii) a small decrease in the sum of $R_g+R_f$ (195.2 compared with 195.3), (iv) a decrease in CRI R9 (85.3 compared with 97.2), and (v) a decrease in CRI Ra (91.9 compared with 94.6). It is to be noted that while the 2% increase in Gamut Index $R_g$ may result in a 7% reduction luminous efficacy LE (253.6 lm/$W_{opt}$ compared with 271.7 lm/$W_{opt}$), Dev.6 still has a high luminous efficacy LE of about 254 lm/$W_{opt}$.

Figure 8:
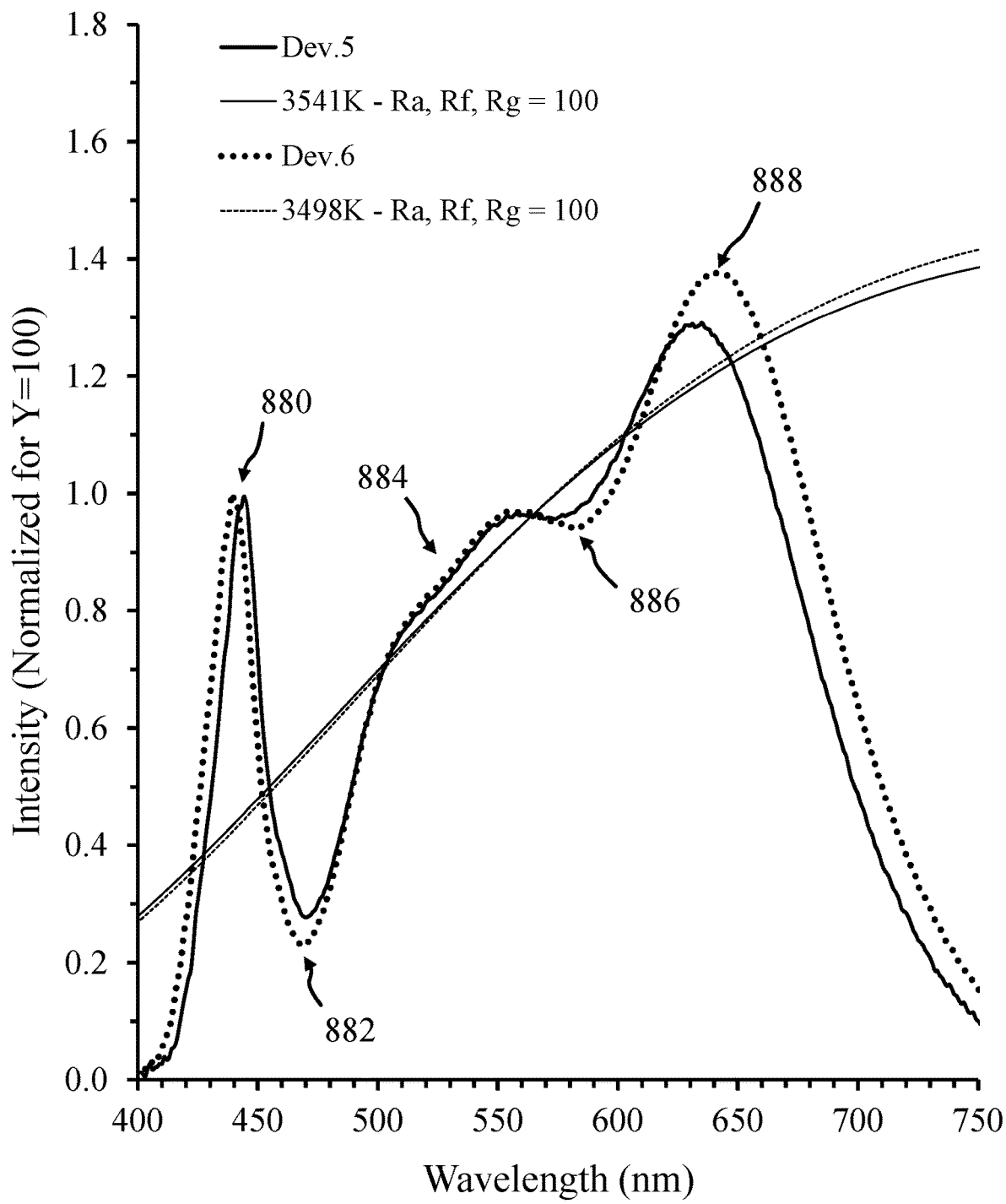
FIG. 8 shows emission spectra, normalized intensity (normalized to a CIE 1931 XYZ relative luminance Y=100) versus wavelength (nm) for (i) Dev.5 (thick solid line), (ii) Dev.6 (heavy dotted line), (iii) Plankian (blackbody) radiator (thin solid line) of temperature T that is the same as the CCT of Dev.5 (3541K), and (iv) Plankian (blackbody) radiator (light dotted line) of temperature T that is the same as the CCT of Dev.6 (3498K)

FIG. 8 shows emission spectra, normalized intensity versus wavelength (nm) for (i) Dev. 5 (thick solid line), (ii) Dev.6 (heavy dotted line), (iii) Plankian (blackbody) radiator (thin solid line) of temperature T that is the same as the CCT of Dev.5 (3541K), and (iv) Plankian (blackbody) radiator (light dotted line) of temperature T that is the same as the CCT of Dev. 6 (3498K).

As indicated in FIG. 8 and Tables 8 and 9, the effect on the spectral characteristics of light generated by Dev.5 and Dev.6 due to the physical differences between the devices are notably: (i) a reduction in peak emission wavelength $\lambda_{pe}$ (439 nm compared with 444 nm) of the first peak 880, (ii) a small decrease in the wavelength $\lambda_1$ (469 nm compared with 470 nm) of the first spectral feature (local minima or trough) 882, (iii) an increase in the depth (reduction in intensity I) of the first spectral feature 882 relative to the Plankian spectrum (I % of P.S. at is 41% compared with 49%), (iv) a small shift (2 nm) to shorter wavelengths of the wavelength range $\Delta\lambda$ for which the intensity I of the first spectral feature 882 is less than the intensity of the Plankian spectrum ($\Delta\lambda$ for I>P.S.: 453-501 nm compared with 455-504 nm), (v) an increase in the amount by which the intensity of region 884 exceeds the Plankian spectrum (I % of P.S.: 103-106% compared with 103-105%), (vi) an increase in the depth (reduction in intensity I) of the second spectral feature 886 relative to the Plankian spectrum (I % of P.S. at $\lambda_2$: 91% compared with 95%), (vii) a small increase in the wavelength range $\Delta\lambda$ for which the intensity I of the second spectral feature 786 is less than the intensity of the P.S. ($\Delta\lambda$ for I<P.S.: 565-609 nm compared with 564-602 nm), and (viii) an increase in peak emission wavelength $\lambda_{pe}$ of the second peak 888 (643 nm compared with 635 nm). It should also be noted that the second spectral feature 886 for both devices Dev.5 and Dev.6 are both developing into a local minima (trough).

As described above, using excitation light with a shorter dominant wavelength $\lambda_d$ shifts the peak emission wavelength $\lambda_{pe}$ of the first peak 880 to shorter wavelengths and results in the decrease in intensity of the first spectral feature (trough) 882. Moreover, using a higher proportion of green phosphor of total phosphor content and/or a red phosphor having a longer peak emission wavelength $\lambda_{pe}$ can have a twofold effect on the spectral characteristics. First, having a higher proportion of green phosphor results in an increase in the amount the intensity within the region 884 exceeds the Plankian spectrum and it is believed that this results in an increase in Gamut Index $R_g$. Second, use of a red phosphor with a longer peak emission wavelength is believed to result in the second spectral feature 886 having an intensity that drops further below the Plankian spectrum and this may account for the decrease in CRI R9.

Referring to Tables 5 and 6 it is to be noted that devices Dev.5 and Dev.6 produce white light having (i) a respective chromaticity of about 2.2 (−2.21) and about 2.8 (−2.84) MacAdam ellipses (SDCM—Standard Deviation Color Matching) below (lower than) the blackbody curve (locus) on a CIE 1931 chromaticity diagram, (ii) a respective IEC TM-30 Gamut Index $R_g$ of about 105 (105.4) and about 108 (107.7), (iii) a respective IEC TM-30 Fidelity Index $R_f$ of about 91 (90.9) and about 88 (87.5), (iv) a respective sum of $R_g+R_f$ of about 195 (195.3) and about 195 (195.2), and (v) a respective CRI R9 of about 97 (97.2) and about 85 (85.3).

4000K White Light Emitting Devices

Both devices Dev.7 and Dev.8 are configured to generate white light of nominal CCT of 4000K. Similar to devices Dev.1 to Dev.6, the physical differences between Dev.7 and Dev.8 are: (i) the excitation light of Dev.8 is of a shorter dominant wavelength ($\lambda_d$=447 nm compared with 450 nm), (ii) a higher proportion of green phosphor (93.0% compared with 86.5%), and (iii) the red phosphor has a longer peak emission wavelength ($\lambda_{pe}$=655 nm compared with 650 nm)—Tables 4 and 5.

As indicated in Table 6 these physical differences result in (i) an increase in Gamut Index $R_g$ (107.6 compared with 105.0), (ii) a decrease in Fidelity Index $R_f$ (86.5 compared with 89.8), (iii) a small decrease in the sum of $R_g+R_f$ (194.1 compared 194.8), (iv) a decrease in CRI R9 (88.6 compared with about 93.0), and (v) a decrease in CRI Ra (90.7 compared with 92.8). It is to be noted that while the 2% increase in Gamut Index $R_g$ may result in a 7% reduction luminous efficacy LE (257.9 lm/$W_{opt}$ compared with 275.9 lm/$W_{opt}$), Dev.8 still has a high luminous efficacy LE of about 258 lm/$W_{opt}$.

Figure 9:
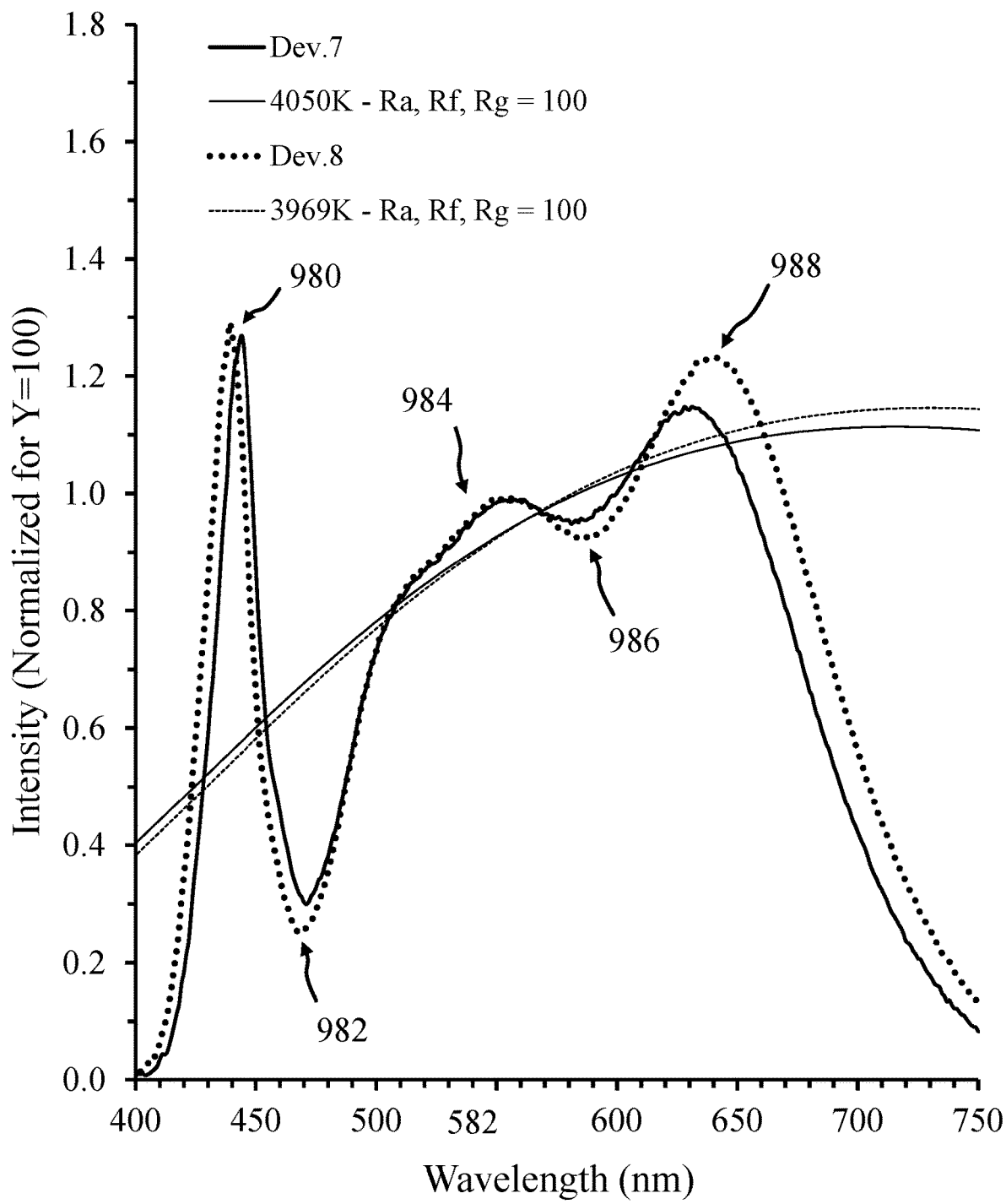
FIG. 9 shows emission spectra, normalized intensity (normalized to a CIE 1931 XYZ relative luminance Y=100) versus wavelength (nm) for (i) Dev.7 (thick solid line), (ii) Dev.8 (heavy dotted line), (iii) Plankian (blackbody) radiator (thin solid line) of temperature T that is the same as the CCT of Dev.7 (4050K), and (iv) Plankian (blackbody) radiator (light dotted line) of temperature T that is the same as the CCT of Dev.8 (3969K).

FIG. 9 shows emission spectra, normalized intensity versus wavelength (nm) for (i) Dev. 7 (thick solid line), (ii) Dev.8 (heavy dotted line), (iii) Plankian (blackbody) radiator (thin solid line) of temperature T that is the same as the CCT of Dev.7 (4050K), and (iv) Plankian (blackbody) radiator (light dotted line) of temperature T that is the same as the CCT of Dev.8 (3969K).

As indicated in FIG. 9 and Tables 8 and 9, the effect on the spectral characteristics of light generated by Dev.7 and Dev.8 due to the physical differences between the devices are notably: (i) a reduction in peak emission wavelength $\lambda_{pe}$ (439 nm compared with 444 nm) of the first peak 980, (ii) a small decrease in the wavelength $\lambda_1$ (469 nm compared with 471 nm) of the first spectral feature (local minima or trough) 982, (iii) an increase in the depth (reduction in intensity I) of the first spectral feature 982 relative to the Plankian spectrum (I % of P.S. at $\lambda_1$: 38% compared with 44%), (iv) a small shift (3 nm) to shorter wavelengths of the wavelength range $\Delta\lambda$ for which the intensity I of the first spectral feature 982 is less than the intensity of the Plankian spectrum ($\Delta\lambda$ for I>P.S.: 452-504 nm compared with 455-507 nm), (v) an increase in the amount by which the intensity of region 984 exceeds the Plankian spectrum (I % of P.S.: 102-107% compared with 102-106%), (vi) an increase in the depth (reduction in intensity I) of the second spectral feature (local minima or trough) 986 relative to the Plankian spectrum (I % of P.S. at $\lambda_2$: 93% compared with 95%), (vii) a small increase in the wavelength range $\Delta\lambda$ for which the intensity I of the second spectral feature 986 is less than the intensity of the P.S. ($\Delta\lambda$ for I<P.S.: 569-610 nm compared with 569-605 nm), and (viii) an increase in peak emission wavelength $\lambda_{pe}$ of the second peak 988 (641 nm compared with 631 nm). It should also be noted that the second spectral feature 986 for both devices Dev.7 and Dev.8 are both a local minima (trough).

As described above, using excitation light with a shorter dominant wavelength $\lambda_d$ shifts the peak emission wavelength $\lambda_{pe}$ of the first peak 980 to shorter wavelengths and results in the decrease in intensity of the first spectral feature (trough) 982. Moreover, using a higher proportion of green phosphor of total phosphor content and/or a red phosphor having a longer peak emission wavelength $\lambda_{pe}$ can have a twofold effect on the spectral characteristics. First, having a higher proportion of green phosphor results in an increase in the amount the intensity within the region 984 exceeds the Plankian spectrum and it is believed that this results in an increase in Gamut Index $R_g$. Second, use of a red phosphor with a longer peak emission wavelength is believed to result in the second spectral feature 986 having an intensity that drops further below the Plankian spectrum and this may account for the decrease in CRI R9.

Referring to Tables 5 and 6 it is to be noted that devices Dev.7 and Dev.8 produce white light having (i) a respective chromaticity of about 1.6 (−1.58) and about 2.8 (−2.80) MacAdam ellipses (SDCM—Standard Deviation Color Matching) below (lower than) the blackbody curve (locus) on a CIE 1931 chromaticity diagram, (ii) a respective IEC TM-30 Gamut Index $R_g$ of about 105 (105.0) and about 108 (107.6), (iii) a respective IEC TM-30 Fidelity Index $R_f$ of about 90 (89.8) and about 87 (86.5), (iv) a respective sum of $R_g+R_f$ of about 195 (194.8) and about 194 (194.1), and (v) a respective CRI R9 of about 93 (93.0) and about 89 (88.6).

In summary, high gamut light emitting devices in accordance with the invention can be characterized by comprising one or more features selected from:
  a solid-state excitation source operable to generate excitation light having a dominant wavelength ranging from 440 nm to 455 nm, ranging from 445 nm to 450 nm, or ranging from 447 nm to 450 nm;
  a first photoluminescence material which generates light having a peak emission wavelength ranging from 500 nm to 530 nm or ranging from 520 nm to 530 nm; and/or
  a second photoluminescence material which generates light having a peak emission wavelength ranging from 640 nm to 690 nm or ranging from 650 nm to 670 nm.

Further, high gamut light emitting devices in accordance with the invention can be characterized by being configured and/or operable to generate white light having one or more characteristics selected from:
  a Correlated Color Temperature (CCT) ranging from 2500K to 5500K;
  a IEC TM-30 Gamut Index $R_g$ of greater than or equal to 105, an $R_g$ which ranges from 105 to 115, from 105 to 110, or from 105 to 108;
  a IEC TM-30 Fidelity Index $R_f$ which ranges from 85 to 95, or from 86 to 92;
  a sum ($R_g+R_g$) of Gamut Index $R_g$ and Fidelity Index $R_f$ greater than or equal to 194 or ranges from 194 to 197;
  a chromaticity (color point) that ranges from 1 to 3 MacAdam ellipses (SDCM) below the blackbody curve on a CIE 1931 chromaticity diagram;
  a CRI Ra of greater than or equal to 90;

a CRI R9 ("Saturated Red") of greater than or equal to about 85 or ranges from 85 to 97;

a luminous efficacy LE of greater than or equal to 240 lm/$W_{opt}$ or ranges from about 240 lm/$W_{opt}$ to about 275 lm/$W_{opt}$;

a spectrum with a first spectral feature comprising a first local minimum (trough) at a first wavelength $\lambda_1$ that ranges from 450 to 490 nm or at a first wavelength of about 470 nm and/or having an intensity that ranges from 35% to 50% of the intensity of the Plankian spectrum at the first wavelength and/or an intensity I is less than the intensity of the Plankian spectrum over a wavelength range $\Delta\lambda$ about 450 to about 510 nm;

a spectrum with a spectral feature comprising a wavelength region having an intensity I that is greater than the intensity of the Plankian spectrum P.S. (at least 102%—preferably 102% to 112%) for wavelength ranging from 508 nm to 555 nm;

a spectrum with a second spectral feature comprising a second local minimum (trough) or point of inflection at a second wavelength that ranges from 550 to 600 nm or at a second wavelength of about 570 nm and/or having a normalized intensity ranging from 90% to 96% of the intensity of the Plankian spectrum at second wavelength and/or an intensity I is less than the intensity of the Plankian spectrum over a wavelength range $\Delta\lambda$ about 550 to about 610 nm; and/or a spectrum with a spectral feature comprising a peak with an intensity I that is greater than the Plankian spectrum P.S. for wavelengths ranging from 600 nm to 640 nm and/or an intensity that is at least 105% of the Plankian Spectrum P.S. at the peak emission wavelength.

Although the present invention has been particularly described with reference to certain embodiments thereof, it should be readily apparent to those of ordinary skill in the art that changes and modifications in the form and details may be made without departing from the spirit and scope of the invention.

It will be understood that the following clauses are not claims, and form part of the specification and the disclosure of the invention defined herein. More particularly, the invention herein may be defined by the combination of the features of the clauses as detailed below and one or more of those clauses may be utilized to amend the combination of the features within the claims of this application.

Clause 1. A white light emitting device comprising:
a solid-state excitation source operable to generate excitation light having a dominant wavelength ranging from 440 nm to 455 nm;
a first photoluminescence material which generates light having a peak emission wavelength ranging from 500 nm to 530 nm; and
a second photoluminescence material which generates light having a peak emission wavelength ranging from 640 nm to 690 nm,
wherein the device is operable to generate white light with an IEC TM-30 Gamut Index $R_g$ of greater than or equal to 105.

Clause 2. The light emitting device of Clause 1, wherein the first photoluminescence material generates light having a peak emission wavelength ranging from 520 nm to 530 nm.

Clause 3. The light emitting device of Clause 1 or Clause 2, wherein the second photoluminescence material generates light having a peak emission wavelength ranging from 650 nm to 670 nm.

Clause 4. The light emitting device of Clause 1 to Clause 3, wherein the Gamut Index $R_g$ ranges from 105 to 115, from 105 to 110, or from 105 to 108.

Clause 5. The light emitting device of any preceding clause, wherein the device is configured to generate white light having an IEC TM-30 Fidelity Index $R_f$ ranging from 85 to 95, or from 86 to 92.

Clause 6. The light emitting device of Clause 5, wherein a sum of Gamut Index $R_g$ and Fidelity Index $R_f$ is greater than or equal to 194 or ranging from 194 to 197.

Clause 7. The light emitting device of any preceding clause, wherein the device is configured to generate white light having a CRI Ra of greater than or equal to 90.

Clause 8. The light emitting device of any preceding clause, wherein the device is configured to generate white light having a color temperature ranging from 2500K to 5500K.

Clause 9. The light emitting device of Clause 9, wherein the device is configured to generate white light having a chromaticity that is ranges from 1 to 3 MacAdam ellipses below the blackbody curve on a CIE 1931 chromaticity diagram.

Clause 10. The light emitting device of any preceding clause, wherein the device is configured to generate white light having a CRI R9 of greater than or equal to about 85.

Clause 11. The light emitting device of any preceding clause, wherein the device is configured to generate white light having a spectrum with a first spectral feature comprising a first local minimum at a first wavelength that ranges from 450 to 490 nm or at a first wavelength of about 470 nm.

Clause 12. The light emitting device of Clause 11, wherein the first spectral feature has an intensity that ranges 35% to 50% of the intensity of the Plankian spectrum at the first wavelength.

Clause 13. The light emitting device of any preceding clause, wherein the device is configured to generate white light having a spectrum with a second spectral feature comprising a second local minimum or point of inflection at a second wavelength that ranges from 550 to 600 nm or at a second wavelength of about 570 nm.

Clause 14. The light emitting device of Clause 13, wherein the second spectral feature has an intensity ranging from 90% to 96% of the intensity of the Plankian spectrum at the second wavelength.

Clause 15. The light emitting device of any preceding clause, wherein the solid-state excitation source is configured to generate excitation light having a dominant wavelength ranging from 440 nm to 452 nm, a dominant wavelength ranging from 445 nm to 450 nm, or a dominant wavelength ranging from 447 nm to 450 nm.

Clause 16. The light emitting device of any preceding clause, wherein at least one of the first or second photoluminescence materials generate light having a FWHM ranging from 50 nm to 100 nm.

Clause 17. The light emitting device of any preceding clause, wherein the first photoluminescence material and second photoluminescence material are located remotely to the solid-state excitation source.

Clause 18. The light emitting device of any preceding clause, wherein the first photoluminescence material comprises a silicate-based phosphor, or a cerium activated garnet phosphor selected from the group consisting of an yttrium-based YAG phosphor and a lutetium-based LuAG phosphor.

Clause 19. The light emitting device of any preceding clause, wherein the second photoluminescence material comprises a europium activated nitride-based phosphor selected from the group consisting of $(Ca_{1-x}Sr_x)AlSiN_3$:Eu wherein $0.5<x\leq1$, and $Ba_{2-x}Sr_xSi_5N_8$:Eu wherein $0\leq x\leq2$.

Clause 20. A white light emitting device comprising:
a solid-state excitation source operable to generate blue excitation light;
a green photoluminescence material; and
a red photoluminescence material,
wherein the device is operable to generate white light with an IEC TM-30 Gamut Index $R_g$ ranging from 105 to 115, and an IEC TM-30 Fidelity Index $R_f$ of ranging from 85 to 95.

Clause 21. The light emitting device of Clause 20, wherein the device is configured to generate white light with an IEC TM-30 Gamut Index $R_g$ ranging from 105 to 110, or from 105 to 108.

Clause 22. The light emitting device of Clause 20 or Clause 21, wherein the device is configured to generate white light with an IEC TM-30 Fidelity Index $R_f$ of ranging from 86 to 92.

Clause 23. The light emitting device of any of Clauses 20 to 22, wherein a sum of Gamut Index $R_g$ and Fidelity Index $R_f$ is greater than or equal to 194 or is ranging from 194 to 197.

Clause 24. The light emitting device of any of Clauses 20 to 23, wherein the device is configured to generate white light with a CRI Ra of greater than or equal to 90.

Clause 25. The light emitting device of any of Clauses 20 to 24, wherein the device is configured to generate white light having a color temperature ranging from 2500K to 5000K.

Clause 26. The light emitting device of any of Clauses 20 to 25, wherein the device is configured to generate white light having a chromaticity that ranges from 1 to 3 MacAdam ellipses below the blackbody curve on a CIE 1931 chromaticity diagram.

Clause 27. The light emitting device of any of Clauses 20 to 26, wherein the device is configured to generate white light having a CRI R9 of greater than or equal to about 85.

Clause 28. The light emitting device of any of Clauses 20 to 27, wherein the device is configured to generate white light having a spectrum with a first spectral feature comprising a first local minimum at a first wavelength that ranges from 450 to 490 nm or at a first wavelength of about 470 nm.

Clause 29. The light emitting device of Clause 28, wherein the first spectral feature has an intensity that ranges from 35% to 50% of the intensity of the Plankian spectrum at the first wavelength.

Clause 30. The light emitting device of any of Clauses 20 to 29, wherein the device is configured to generate white light having a spectrum with a second spectral feature comprising a second local minimum or point of inflection at a second wavelength that ranges from 550 to 600 nm or at a second wavelength of about 570 nm.

Clause 31. The light emitting device of Clause 30, wherein the second spectral feature has an intensity ranging from 90% to 96% of the intensity of the Plankian spectrum at the second wavelength.

Clause 32. The light emitting device of any of Clauses 20 to 31, wherein the solid-state excitation source is configured to generate excitation light having a dominant wavelength ranging from 440 nm to 455 nm, from 440 nm to 452 nm, from 445 nm to 450 nm, or from 447 nm to 450 nm.

Clause 33. The light emitting device of any of Clauses 20 to 32, wherein the green photoluminescence material generates light having a peak emission wavelength ranging from 500 nm to 530 nm or a range 520 nm to 530 nm.

Clause 34. The light emitting device of any of Clauses 20 to 33, wherein the red photoluminescence material generates light having a peak emission wavelength ranging from 640 nm to 690 nm or a range from 650 nm to 670 nm.

Clause 35. The light emitting device of any of Clauses 20 to 34, wherein at least one of the green or red photoluminescence materials generate light having a FWHM ranging from 50 nm to 100 nm.

Clause 36. The light emitting device of any of Clauses 20 to 35, wherein the green photoluminescence material and red photoluminescence material are located remotely to the solid-state excitation source.

Clause 37. The light emitting device of any of Clauses 20 to 36, wherein the green photoluminescence material comprises a silicate-based phosphor, or a cerium activated garnet phosphor selected from the group consisting of an yttrium-based YAG phosphor and a lutetium-based LuAG phosphor.

Clause 38. The light emitting device of any of Clauses 20 to 37, wherein the second photoluminescence material comprises a europium activated nitride-based phosphor selected from the group consisting of $(Ca_{1-x}Sr_x)AlSiN_3$:Eu wherein $0.5<x\leq1$, and $Ba_{2-x}Sr_xSi_5N_8$:Eu wherein $0\leq x\leq2$.

Clause 39. A white light emitting device comprising:
a solid-state excitation source operable to generate blue excitation light;
a first photoluminescence material; and
a second photoluminescence material,
wherein the device is operable to generate white light in which a sum of an IEC TM-30 Gamut Index $R_g$ and an IEC TM-30 Fidelity Index $R_f$ ranges from 194 to 200.

Clause 40. The light emitting device of Clause 39, wherein the device is configured to generate white light having a Gamut Index $R_g$ which ranges from 105 to 115, from 105 to 110, or from 105 to 108.

Clause 41. The light emitting device of Clause 39 or Clause 40, wherein the device is configured to generate white light having a Fidelity Index $R_f$ which ranges from 85 to 95, or from 86 to 92.

Clause 42. The light emitting device of any of Clauses 39 to 41, wherein a sum of Gamut Index $R_g$ and Fidelity Index $R_f$ is from 194 to 197.

Clause 43. The light emitting device of any of Clauses 39 to 42, wherein the device is configured to generate white light having a CRI Ra of greater than or equal to 90.

Clause 44. The light emitting device of any of Clauses 39 to 43, wherein the device is configured to generate white light having a color temperature ranging from 2500K to 5000K.

Clause 45. The light emitting device of Clause 44, wherein the device is configured to generate white light having a chromaticity that ranges from 1 to 3 MacAdam ellipses below the black body curve on a CIE 1931 chromaticity diagram.

Clause 46. The light emitting device of any of Clauses 39 to 45, wherein the device is configured to generate white light having a CRI R9 of greater than or equal to about 85.

Clause 47. The light emitting device of any of Clauses 39 to 46, wherein the device is configured to generate white light having a spectrum with a first spectral feature comprising a first local minimum at a first wavelength that ranges from 450 to 490 nm or about 470 nm.

Clause 48. The light emitting device of Clause 47, wherein the first spectral feature has an intensity that ranges from 35% to 50% of the intensity of the Plankian spectrum at the first wavelength.

Clause 49. The light emitting device of any of Clauses 39 to 48, wherein the device is configured to generate white light having a spectrum with a second spectral feature comprising a second local minimum or point of inflection at a second wavelength that ranges from 550 to 600 nm or at a second wavelength of about 570 nm.

Clause 50. The light emitting device of Clause 49, wherein the second spectral feature has an intensity ranging from 90% to 96% of the intensity of the Plankian spectrum at the second wavelength.

Clause 51. The light emitting device of any of Clauses 39 to 50, wherein the solid-state excitation source is configured to generate excitation light having a dominant wavelength ranging from 440 nm to 455 nm, from 440 nm to 452 nm, from 445 nm to 450 nm, or from 447 nm to 450 nm.

Clause 52. The light emitting device of any of Clauses 39 to 51, wherein the green photoluminescence material generates light having a peak emission wavelength ranging from 500 nm to 530 nm or a range 520 nm to 530 nm.

Clause 53. The light emitting device of any of Clauses 39 to 52, wherein the red photoluminescence material generates light having a peak emission wavelength ranging from 640 nm to 690 nm or a range from 650 nm to 670 nm.

Clause 54. The light emitting device of any of Clauses 39 to 53, wherein at least one of the green or red photoluminescence materials generate light having a FWHM ranging from 50 nm to 100 nm.

Clause 55. The light emitting device of any of Clauses 39 to 54, wherein the first photoluminescence material and second photoluminescence material are located remotely to the solid-state excitation source.

Clause 56. The light emitting device of any of Clauses 39 to 55, wherein the first photoluminescence material comprises a silicate-based phosphor, or a cerium activated garnet phosphor selected from the group consisting of an yttrium-based YAG phosphor and a lutetium-based LuAG phosphor.

Clause 57. The light emitting device of any of Clauses 39 to 56, wherein the second photoluminescence material comprises a europium activated nitride-based phosphor selected from the group consisting of $(Ca_{1-x}Sr_x)AlSiN_3$:Eu wherein $0.5<x\leq1$, and $Ba_{2-x}Sr_xSi_5N_8$:Eu wherein $0\leq x\leq 2$.

Clause 58. Use of the light emitting device of any preceding clause to generate white light with an IEC TM-30 Gamut Index $R_g$ of greater than or equal to 105.

Clause 59. A method of generating white light with an IEC TM-30 Gamut Index $R_g$ of greater than or equal to 105, the method comprising the steps of:
 providing a solid-state excitation source operable to generate excitation light having a dominant wavelength ranging from 440 nm to 455 nm;
 providing a first photoluminescence material which generates light having a peak emission wavelength ranging from 500 nm to 530 nm;
 providing a second photoluminescence material which generates light having a peak emission wavelength ranging from 640 nm to 690 nm; and
 exciting said first and second photoluminescence materials with the excitation light.

Clause 60. The method of Clause 59, wherein the gamut index $R_g$ ranges from 105 to 115, from 105 to 110, or from 105 to 108.

Clause 61. The method of Clause 59 or Clause 60, wherein the IEC TM-30 Fidelity Index $R_f$ ranges from 85 to 95, or from 86 to 92.

Clause 62. The method of any of Clauses 59 to 61, wherein a sum of Gamut Index $R_g$ and Fidelity Index $R_f$ is greater than or equal to 194.

Clause 63. The method of any of Clauses 59 to 62, wherein a sum of Gamut Index $R_g$ and Fidelity Index $R_f$ ranges from 194 to 197.

What is claimed is:

1. A white light emitting device comprising:
 a solid-state excitation source which generates excitation light having a dominant wavelength from 440 nm to 455 nm;
 a first photoluminescence material which generates light having a peak emission wavelength from 500 nm to 530 nm; and
 a second photoluminescence material which generates light having a peak emission wavelength from 640 nm to 690 nm,
 wherein the device generates white light of a selected color temperature with an IEC TM-30 Gamut Index $R_g$ from 105 to 115 and a Fidelity Index $R_f$ from 85 to 95; and
 wherein the white light has a spectrum with a first region in a wavelength range from 508 nm to 555 nm whose intensity is greater than an intensity of a Planckian spectrum of the selected color temperature and a second region in a wavelength range from 560 nm to 600 nm whose intensity is less than the intensity of the Planckian spectrum; and
 wherein the white light has a chromaticity that is 1 to 3 MacAdam ellipses lower than the blackbody curve of the selected color temperature on a CIE 1931 chromaticity diagram.

2. The light emitting device of claim 1, wherein the white light has a first local minimum at a first wavelength from 450 nm to 490 nm or at a first wavelength of about 470 nm and wherein the first local minimum has an intensity from 35% to 50% of the intensity of the Planckian spectrum at the first wavelength.

3. The light emitting device of claim 1, wherein the intensity of light in the second region is from 102% to 112% the intensity of the Planckian spectrum.

4. The light emitting device of claim 1, wherein the white light has a third region whose intensity is greater than the intensity of the Planckian spectrum in a wavelength range from 600 nm to 640 nm.

5. The light emitting device of claim 4, wherein the third region has an intensity that is from 105% to 112% the intensity of the Plankian spectrum.

6. The light emitting device of claim 1, wherein the Gamut Index $R_g$ is selected from the group consisting of: from 105 to 110, and from 105 to 108.

7. The light emitting device of claim 1, wherein the white light has an IEC TM-30 Fidelity Index $R_f$ from 86 to 92.

8. The light emitting device of claim 1, wherein a sum of Gamut Index $R_g$ and Fidelity Index $R_f$ is from 194 to 197.

9. The light emitting device of claim 1, wherein the white light has a CRI Ra of greater than or equal to 90.

10. The light emitting device of claim 1, wherein the white light has a CRI R9 of greater than or equal to about 85.

11. The light emitting device of claim 1, wherein the solid-state excitation source is operable to generate excitation light having a dominant wavelength ranging: from 440 nm to 452 nm, from 445 nm to 450 nm, and from 447 nm to 450 nm.

12. The light emitting device of claim 1, wherein at least one of: the first photoluminescence material generates light having a peak emission wavelength ranging from 520 nm to 530 nm, and the second photoluminescence material generates light having a peak emission wavelength ranging from 650 nm to 670 nm.

13. The light emitting device of claim 1, wherein at least one of the first or second photoluminescence materials generate light having a FWHM ranging from 50 nm to 100 nm.

14. The light emitting device of claim 1, wherein the light emitting device has a luminous efficacy of greater than or equal to 240 lm/$W_{opt}$.

15. The light emitting device of claim 1, wherein the first photoluminescence material comprises from 80 wt % to 95 wt % of a total photoluminescence material content.

* * * * *